(12) United States Patent  
Koike et al.

(10) Patent No.: US 9,129,979 B2  
(45) Date of Patent: Sep. 8, 2015

(54) SEMICONDUCTOR DEVICE

(75) Inventors: Nobuya Koike, Tokyo (JP); Atsushi Fujiki, Tokyo (JP); Norio Kido, Tokyo (JP); Yukihiro Sato, Tokyo (JP); Hiroyuki Nakamura, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 278 days.

(21) Appl. No.: 13/533,391

(22) Filed: Jun. 26, 2012

(65) Prior Publication Data

US 2012/0261825 A1  Oct. 18, 2012

Related U.S. Application Data

(63) Continuation of application No. 11/841,955, filed on Aug. 20, 2007, now Pat. No. 8,232,629.

(30) Foreign Application Priority Data

Aug. 30, 2006  (JP) ................................ 2006-234061

(51) Int. Cl.  
*H01L 23/48* (2006.01)  
*H01L 21/56* (2006.01)  
(Continued)

(52) U.S. Cl.  
CPC ........ *H01L 21/565* (2013.01); *H01L 23/49503* (2013.01); *H01L 23/49524* (2013.01); *H01L 23/49562* (2013.01); *H01L 23/49575* (2013.01);  
(Continued)

(58) Field of Classification Search  
CPC ........... H01L 2224/48227; H01L 2224/48247; H01L 2224/73265; H01L 24/49; H01L 2924/01082; H01L 2924/14; H01L 24/06; H01L 23/5286; H01L 2224/48463; H01L 2225/0651; H01L 2224/48237; H01L 2224/85  
USPC ............ 257/773, E23.01, 676, 666, 678, 691, 257/703  
See application file for complete search history.

(56) References Cited

U.S. PATENT DOCUMENTS 5,245,216 A  9/1993  Sako  
5,631,476 A  5/1997  Ferla et al.  
(Continued)

FOREIGN PATENT DOCUMENTS

JP    A-04-299849   10/1992  
JP    7-250485 A    9/1995  
(Continued)

OTHER PUBLICATIONS

Notification of Reasons for Refusal dated Feb. 12, 2014, in Japanese Patent Application No. 2012-109878, with English-language translation.

(Continued)

*Primary Examiner* — Cathy N Lam  
(74) *Attorney, Agent, or Firm* — Miles & Stockbridge P.C.

(57) ABSTRACT

It is made for the layout of the mounting wiring at the time of mounting to become efficient by changing the structure of a semiconductor device.

A first chip is mounted on a first die pad, and a second chip is also mounted on a second die pad. A first die pad and a second die pad do division structure in parallel to the first side and second side of sealing body 40. As a result, the pin for an output from a first chip and the pin for control of the circuit for a drive can make it able to project from a counter direction, and can set the wiring layout at the time of mounting as the minimum route.

17 Claims, 34 Drawing Sheets

(51) Int. Cl.
*H01L 23/495* (2006.01)
*H01L 23/00* (2006.01)

(52) U.S. Cl.
CPC ............... *H01L 24/05* (2013.01); *H01L 24/29* (2013.01); *H01L 24/32* (2013.01); *H01L 24/33* (2013.01); *H01L 24/34* (2013.01); *H01L 24/36* (2013.01); *H01L 24/40* (2013.01); *H01L 24/49* (2013.01); *H01L 24/73* (2013.01); *H01L 24/91* (2013.01); *H01L 24/45* (2013.01); *H01L 24/48* (2013.01); *H01L 2224/04042* (2013.01); *H01L 2224/29111* (2013.01); *H01L 2224/29139* (2013.01); *H01L 2224/32245* (2013.01); *H01L 2224/32257* (2013.01); *H01L 2224/45124* (2013.01); *H01L 2224/45144* (2013.01); *H01L 2224/4847* (2013.01); *H01L 2224/48091* (2013.01); *H01L 2224/48137* (2013.01); *H01L 2224/48247* (2013.01); *H01L 2224/48463* (2013.01); *H01L 2224/49171* (2013.01); *H01L 2224/49175* (2013.01); *H01L 2224/73219* (2013.01); *H01L 2224/73221* (2013.01); *H01L 2224/73265* (2013.01); *H01L 2924/01002* (2013.01); *H01L 2924/01004* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01015* (2013.01); *H01L 2924/01022* (2013.01); *H01L 2924/01028* (2013.01); *H01L 2924/01029* (2013.01); *H01L 2924/0132* (2013.01); *H01L 2924/0133* (2013.01); *H01L 2924/01033* (2013.01); *H01L 2924/01047* (2013.01); *H01L 2924/01074* (2013.01); *H01L 2924/01078* (2013.01); *H01L 2924/01079* (2013.01); *H01L 2924/01082* (2013.01); *H01L 2924/1305* (2013.01); *H01L 2924/13055* (2013.01); *H01L 2924/13091* (2013.01)

(56) References Cited

U.S. PATENT DOCUMENTS

| | | | |
|---|---|---|---|
| 5,715,147 A * | 2/1998 | Nagano | 361/813 |
| 5,792,676 A | 8/1998 | Masumoto et al. | |
| 6,005,366 A | 12/1999 | Majumdar | |
| 6,522,098 B1 | 2/2003 | Majumdar et al. | |
| 6,593,622 B2 | 7/2003 | Kinzer et al. | |
| 6,774,466 B1 | 8/2004 | Kajiwara | |
| 6,992,385 B2 | 1/2006 | Satou et al. | |
| 7,554,181 B2 | 6/2009 | Satou et al. | |
| 8,232,629 B2 | 7/2012 | Koike et al. | |
| 2002/0033541 A1 | 3/2002 | Ucida | |
| 2005/0023658 A1 | 2/2005 | Tabira et al. | |
| 2005/0181539 A1 * | 8/2005 | Ohie | 438/108 |
| 2005/0224924 A1 * | 10/2005 | Koh et al. | 257/666 |
| 2006/0017141 A1 | 1/2006 | Luo et al. | |
| 2006/0018608 A1 | 1/2006 | Mizoguchi | |
| 2006/0055011 A1 | 3/2006 | Carney et al. | |
| 2011/0269268 A1 * | 11/2011 | Muto et al. | 438/107 |
| 2012/0049337 A1 * | 3/2012 | Uno et al. | 257/676 |

FOREIGN PATENT DOCUMENTS

| | | |
|---|---|---|
| JP | 8-213614 A | 8/1996 |
| JP | H 08-316597 A | 11/1996 |
| JP | 9-102571 A | 4/1997 |
| JP | 2005-005638 A | 1/2005 |
| JP | 2005-051038 A | 2/2005 |
| JP | 2008-060256 A | 3/2008 |

OTHER PUBLICATIONS

Office Action dated Mar. 13, 2012 in Chinese Patent Application No. 2006-234061.

Office Action issued Dec. 2, 2014, in Japanese Patent Application No. 2012-109878.

* cited by examiner

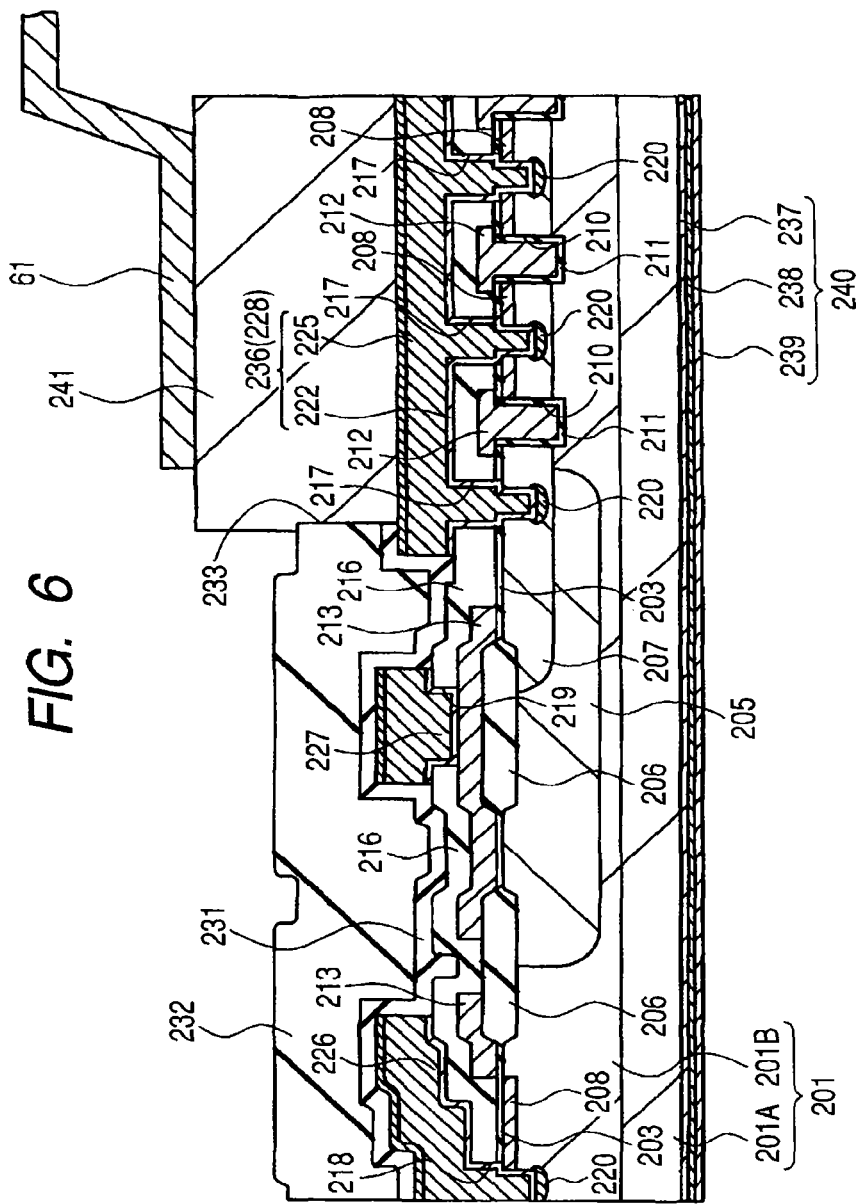

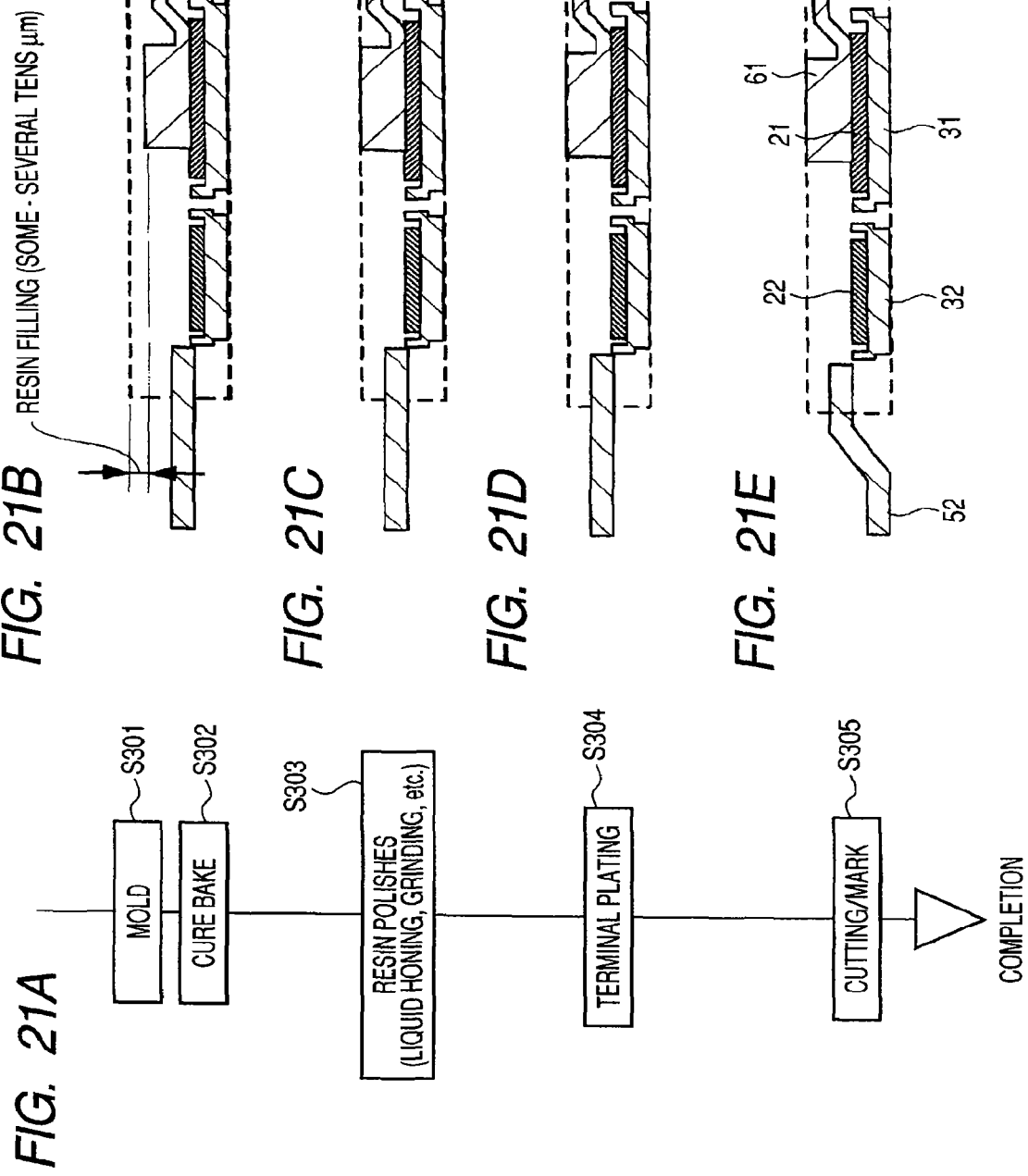

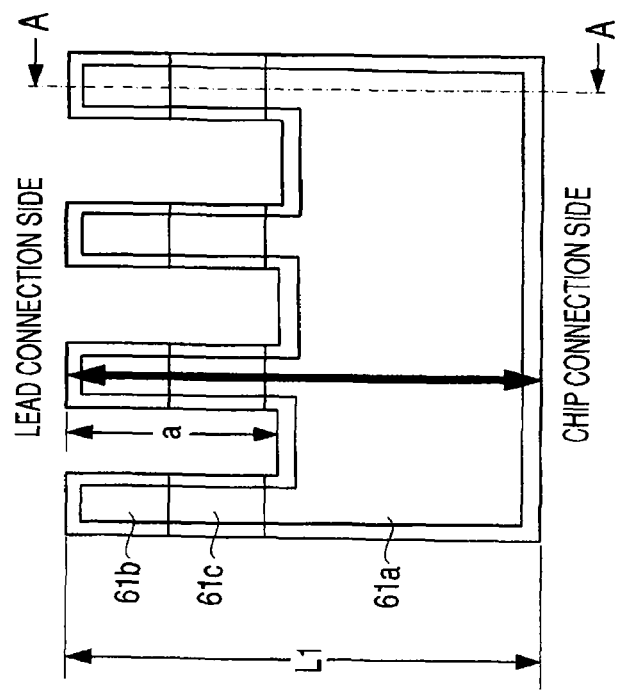
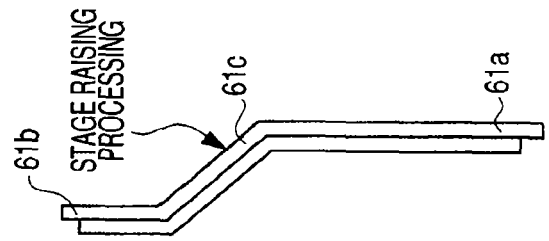
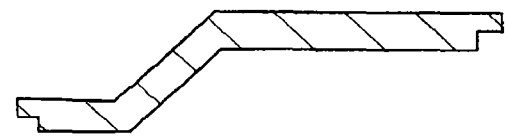

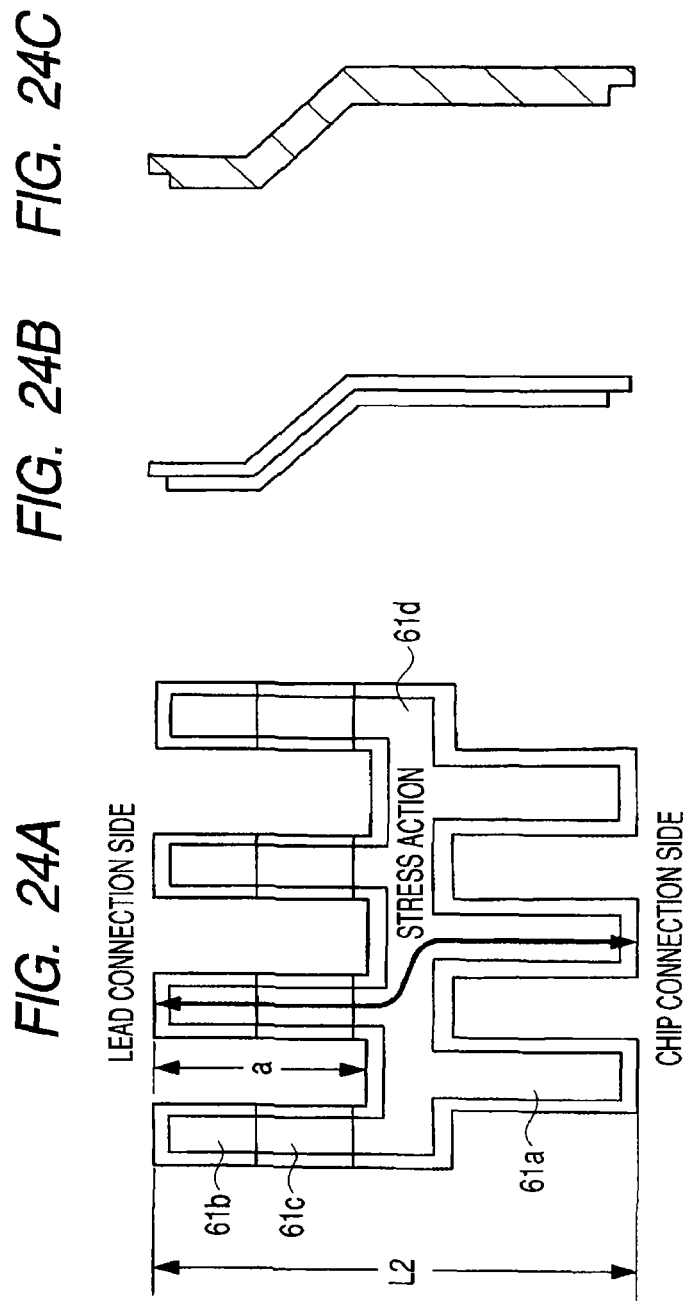

FIG. 26A  FIG. 26B  FIG. 26C
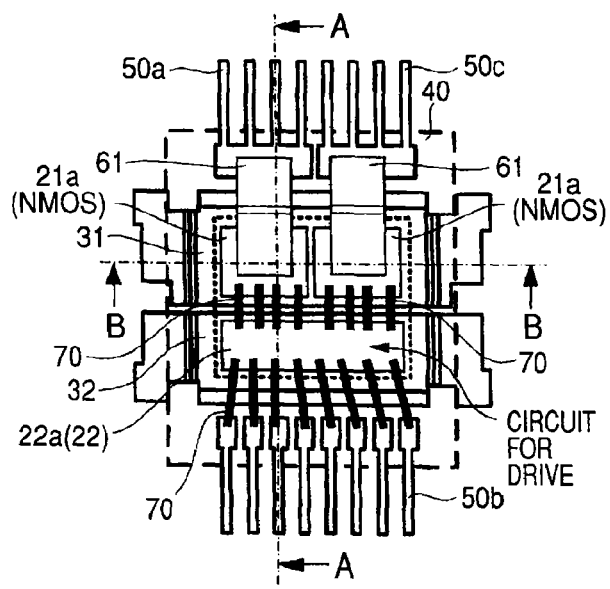
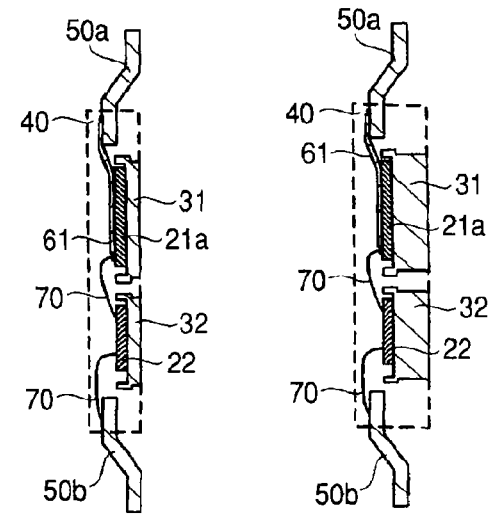
FIG. 26D  FIG. 26E
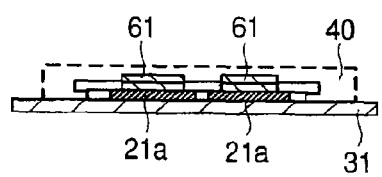
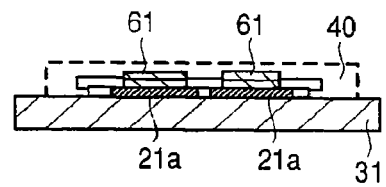
FIG. 26F
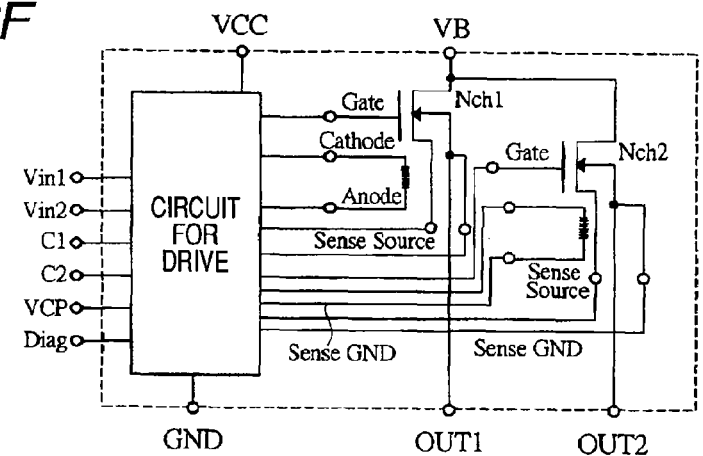

SEMICONDUCTOR DEVICE

CROSS-REFERENCE TO RELATED APPLICATION

The present application is a continuation of application Ser. No. 11/841,955 filed Aug. 20, 2007 now U.S. Pat. No. 8,232,629. The present application also claims priority from Japanese patent application No. 2006-234061 filed on Aug. 30, 2006 the content of which is hereby incorporated by reference into this application.

FIELD OF THE INVENTION

The present invention relates to semiconductor technology, and particularly relates to an effective technology in the application to the semiconductor device which includes the semiconductor chip which has a power transistor, and the semiconductor chip which has a circuit for a drive which drives the power transistor in one package.

DESCRIPTION OF THE BACKGROUND ART

The technology explained below was examined by the present inventor when completing the present invention, and the outline is as follows.

Some transistors are called the power transistor which can send big current. Especially this power transistor is used in the circuit for motor drives used by car etc. in recent years, and the demand is large.

In Patent Reference 1, the semiconductor device which includes one semiconductor chip which has a power transistor in one package is disclosed.

The structure in which the semiconductor chip which has a power transistor, and the semiconductor chip which has the circuit for control were accommodated in one package is disclosed by Patent References 2 and 3.

[Patent Reference 1] Japanese Unexamined Patent Publication No. Hei 8-213614

[Patent Reference 2] Japanese Unexamined Patent Publication No. Hei 7-250485

[Patent Reference 3] Japanese Unexamined Patent Publication No. Hei 9-102571

SUMMARY OF THE INVENTION

When the semiconductor chip which has a power transistor, and the semiconductor chip which has a circuit for a drive which drives this power transistor are mounted in another package, respectively, and these packages are mounted in a wiring substrate etc., there is a problem that a mounting area becomes large or an electrical property deteriorates.

On the wiring substrate, other packages by which the semiconductor chip comprising the circuit for control which controls the circuit for a drive is mounted are mounted, and the circuit for control and the circuit for a drive are electrically connected via the wiring on a wiring substrate. In this case, depending on the wiring layout on a wiring substrate, a wire length becomes long, and the problem of leading to degradation of an electrical property occurs.

A purpose of the present invention is to improve the characteristics of a semiconductor device including the semiconductor chip which has a power transistor, and the semiconductor chip which has a circuit for a drive which drives the power transistor.

A purpose of the present invention is to aim at the miniaturization of the semiconductor device.

A purpose of the present invention is to make the structure of a semiconductor device able to perform the wiring at the time of mounting efficiently.

The above-described and the other purposes and novel features of the present invention will become apparent from the description herein and accompanying drawings.

Of the inventions disclosed in the present application, typical ones will next be summarized briefly.

That is, in the present invention, the die pad which mounts chips, such as a power transistor, and the die pad which mounts the chip comprising the circuit for a drive were divided independently. It was made for the pin for an output of the chip of a power transistor and the pin for control of a chip comprising the circuit for a drive to project in a counter direction.

Advantages achieved by some of the most typical aspects of the invention disclosed in the present application will be briefly described below.

In the present invention, the die pad which mounts chips, such as a power transistor, and the die pad which mounts the chip comprising the circuit for a drive were divided independently. It was made for the pin for an output of the chip of a power transistor and the pin for control of a chip comprising the circuit for a drive to project in a counter direction. Hereby, the wiring at the time of mounting can be short set up as the shape of a straight line etc.

BRIEF DESCRIPTION OF THE DRAWINGS

FIG. 6 is a cross-sectional view showing the example of the chip structure of a semiconductor device;

FIG. 21A is a flow diagram showing the step after the mold in the semiconductor device of upper surface heat radiation structure, and FIGS. 21B to 21E are explanatory diagrams showing the contents of a step schematically;

FIG. 23A is a plan view showing the plane structure of a flat electrode schematically, FIG. 23B is a side view, and FIG. 23C is a cross-sectional view;

FIG. 24A is a plan view showing the plane structure of a flat electrode schematically, FIG. 24B is a side view, and FIG. 24C is a cross-sectional view;

FIGS. 26A to 26E are explanatory diagrams showing the structure of the semiconductor device relevant to the present invention, and FIG. 26F is a block diagram showing the circuit configuration;

DETAILED DESCRIPTION OF THE PREFERRED EMBODIMENTS

Figure 1:
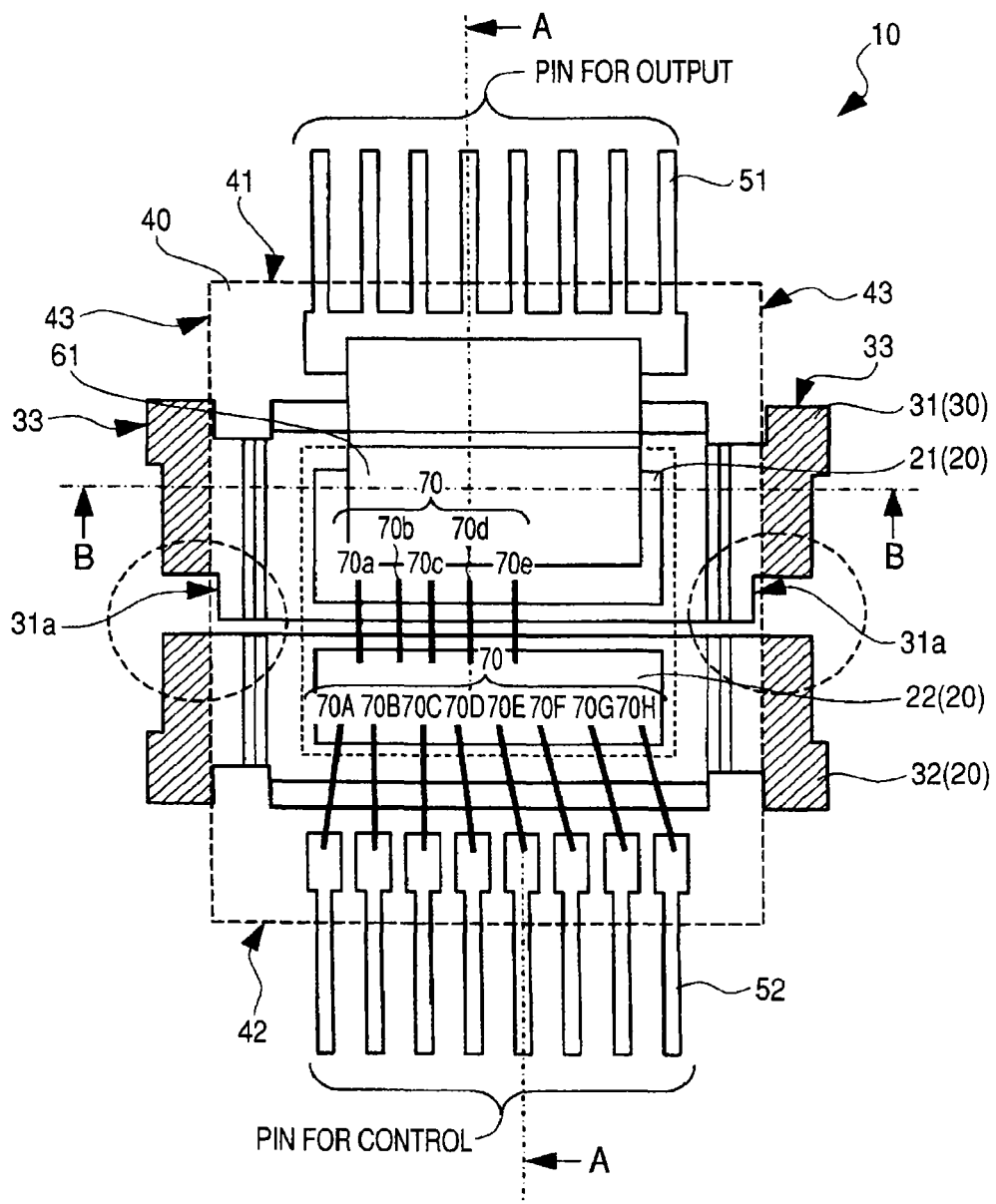
FIG. 1 is a plan view showing schematically the structure of the semiconductor device which is the 1 embodiment of the present invention.

Hereafter, embodiments of the invention are explained in detail based on drawings. In all the drawings for describing the embodiments, members of a like function will be identified by like reference numerals in principle and there is a case where overlapping descriptions will be omitted. With the cross-sectional view used by the following explanation, in order that illustration is made legible, hatching may be excluded.

In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated.

(Embodiment 1)

Figure 2A:
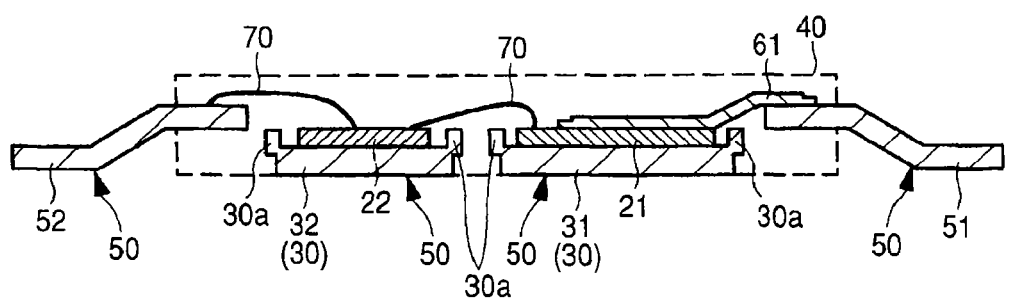
FIGS. 2A and 2B are the cross-sectional views showing schematically the semiconductor device shown in FIG. 1.
Figure 2B:
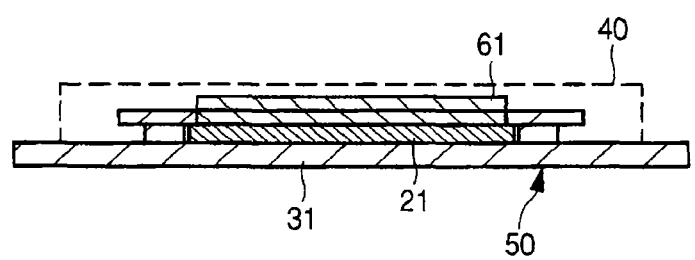
Figure 2C:
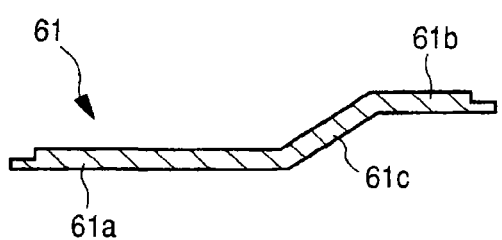
FIG. 2C is a cross-sectional view showing a flat electrode schematically.
Figure 3:
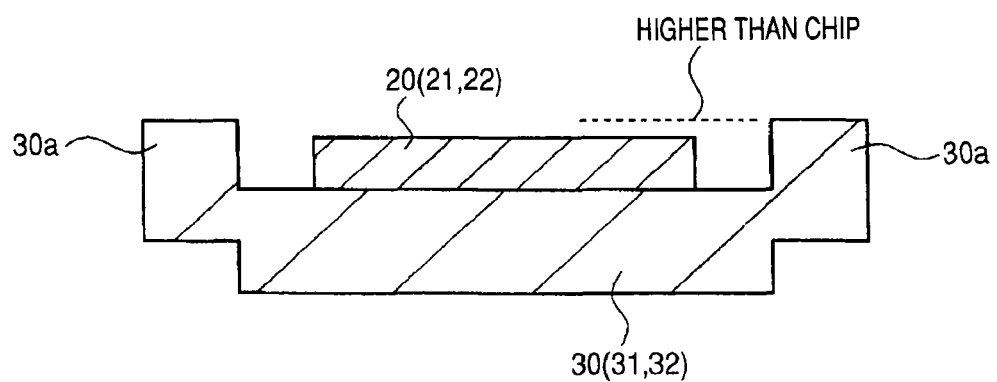
FIG. 3 is a partially sectional view showing the state of a die pad part schematically.
Figure 4:
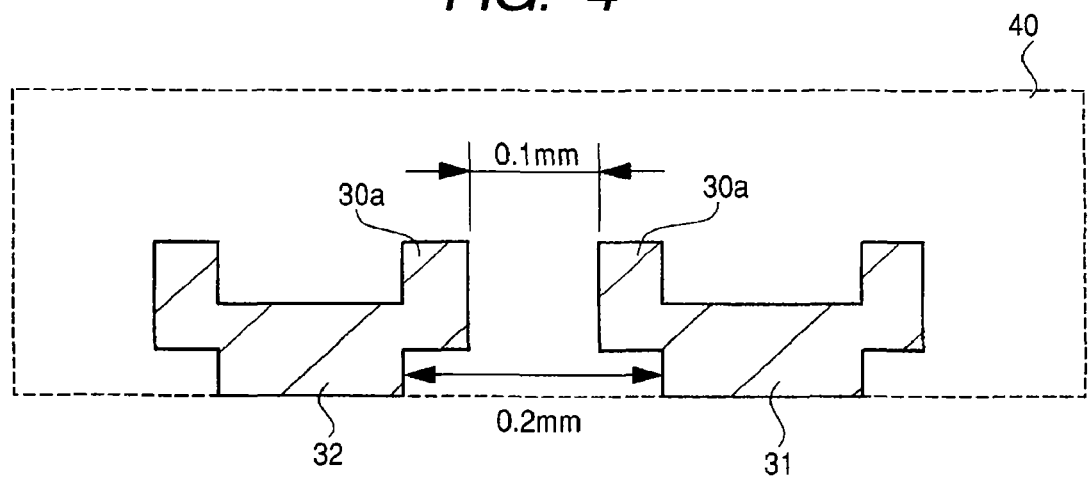
FIG. 4 is an explanatory diagram showing the clearance of a die pad.
Figure 5A:
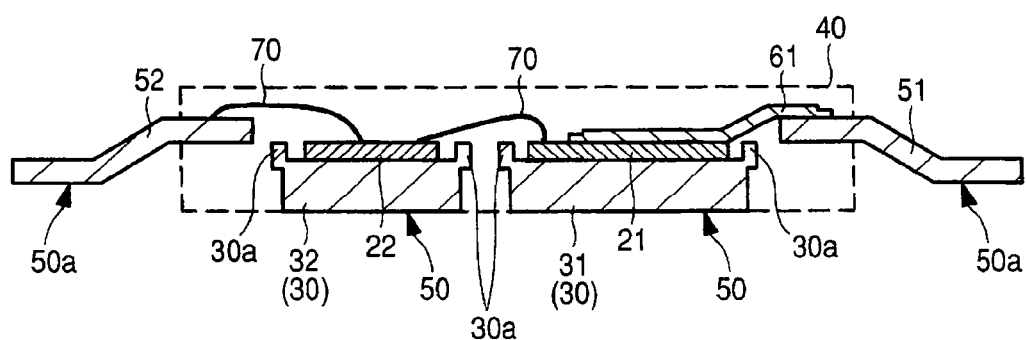
FIGS. 5A and 5B are the cross-sectional views showing the structure of a semiconductor device schematically.

FIG. 1 is a plan view showing schematically an example of the entire configuration of the semiconductor device of the 1 embodiment of the present invention. FIG. 2A is a cross-sectional view showing schematically a state that the A-A line of FIG. 1 cut, FIG. 2B is a cross-sectional view showing schematically a state that the B-B line cut, and FIG. 2C is a cross-sectional view showing the structure of a flat electrode. FIG. 3 is a cross-sectional view showing the appearance of a die pad schematically. FIG. 4 is a section explanatory diagram showing the clearance between die pads. FIG. 5(a) is a cross-sectional view showing schematically the state of cutting by the A-A line at the time of forming the semiconductor device of structure of being shown in FIG. 1 using the lead frame of the structure whose thickness of a die pad part is thicker than a lead, and (b) is a cross-sectional view showing the state of cutting by a B-B line. FIG. 6 is a cross-sectional view showing an example of the semiconductor chip used with the semiconductor device of the present invention.

Semiconductor device 10 of this embodiment mounts a plurality of semiconductor chips (it may be hereafter called a chip simply) 20 in die pad 30 which became independent, respectively. This has package structure which sealed a plurality of semiconductor chips 20 by one sealing body 40.

That is, semiconductor device 10 has first chip 21 including a power transistor and second chip 22 comprising the circuit for a drive which drives a power transistor, as shown in FIG. 1, FIGS. 2A and 2B.

This first chip 21 is mounted on first die pad 31. First chip 21 is electrically connected with pin 51 for an output by flat electrode 61 at the electrode for an output formed in the main surface of a chip.

This flat electrode 61 consists of chip side electrode connection part 61a formed in the shape of a broad plate, and electrode connection part 61b for a lead, as shown in FIG. 2C. The connection surface of chip side electrode connection part 61a and electrode connection part 61b for a lead is formed in parallel mutually. This chip side electrode connection part 61a and electrode connection part 61b for a lead that were formed widely apart and in parallel are connected by connection part 61c.

As this flat electrode 61 is shown in FIG. 2C, the circumference is formed more thinly than the inside. Hereby, the connectivity of the electrode at the side of chip 20 or at the side of pin 51 for an output with flat electrode 61 becomes high.

On the other hand, second chip 22 is electrically connected with pin 52 for control with wire 70 by wire bonding. First chip 21 and second chip 22 are also electrically connected with wire 70 by wire bonding.

That is, Gate terminal a, Cathode terminal b, Anode terminal c, SenseSource terminal d, and SenseGND terminal e of first chip 21 are connected to the corresponding part of second chip 22 by wire 70a, 70b, 70c, 70d, and 70e, respectively. VB terminal A, Vin terminal B, Diag terminal C, C1 terminal D, C2 terminal E, VCP terminal F, VDDTEST terminal G, and GND terminal H of the circuit for a drive of second chip 22 are connected with the corresponding pin of pin 52 for control by wires 70A, 70B, 70C, 70D, 70E, 70F, 70G, and 70H, respectively.

Thus, the structure with which first chip 21 mounted in first die pad 31 and second chip 22 mounted in second die pad 32 are mutually connected with wire 70, and first chip 21 was connected to pin 51 for an output, and second chip 22 was connected to pin 52 for control is sealed by resin, and sealing body 40 is formed.

First chip 21 mounted on first die pad 31 and second chip 22 mounted on second die pad 32 are covered with sealing body 40. As for first die pad 31 and second die pad 32, the portion is covered with sealing body 40.

That is, as it is indicated in FIG. 1, as for first die pad 31 and second die pad 32, exposing portions 33 (portion which indicated by the slash among the drawing as intelligibly) of a part of a side surface are exposed from sealing body 40, and a part of side surface is located in sealing body 40.

As shown in FIGS. 2A and 2B, the back surface side of first die pad 31 and second die pad 32, i.e., a tab portion, is exposed from sealing body 40.

From this sealing body 40, two or more above-mentioned pins 51 for an output and two or more pins 52 for control are projected. The projection direction is formed so that pin 51 for an output and pin 52 for control may turn to the opposite side mutually.

That is, the side at the side of sealing body 40 from which the pin 51 side for an output has projected is made into first side 41, and the side of the side from which pin 52 for control has projected is made into second side 42, from the first side 41 side which faces with second side 42, pin 51 for an output will project. Similarly, pin 52 for control will be projected from the second side 42 side which faces with first side 41.

The arranging direction of these two or more pins 51 for an output is formed so that it may become parallel to first side 41 of sealing body 40. Similarly, pin 52 for control is also formed so that it may become parallel the second side 42 side of sealing body 40.

By performing this pin out, the wire length at the time of mounting of semiconductor device 10 can be shortened. Structure which was seen with conventional structure and which arranges the pin for an output and the pin for control side by side to a same side is a different arrangement configuration.

First chip 21 and second chip 22 are formed in almost rectangular shape, respectively, when shown in FIG. 1. Each long side direction of first chip 21 and second chip 22 is mounted so that it may become parallel mutually with first side 41 and second side 42 of sealing body 40.

First die pad 31 and second die pad 32 which mount first chip 21 and second chip 22 of this structure respectively are made to divide, respectively and independently. The dividing direction of this first die pad 31 and second die pad 32 is divided parallel to the direction where pin 51 for an output and pin 52 for control are arranged, respectively, and between pin 51 for an output, and pin 52 for control, as shown in FIG. 1.

Namely, it is divided in the direction of first side 41 and second side 42 of sealing body 40. Or it can be said that it is divided in the direction which crosses third side 43.

The dividing direction of the conventional die pad was performed towards the dividing directions differing 90 degrees to the dividing direction shown in FIG. 1.

However, in this embodiment, the dividing direction of this die pad 30 was rotated 90 degrees to the conventional dividing direction. Namely, as shown in FIG. 1, it is divided in the direction parallel to first side 41 and second side 42 of sealing body 40 in parallel with and the same direction as the arranging direction of pin 51 for an output, and pin 52 for control.

In this die pad 30, as shown in FIG. 2A and FIG. 3, as for the both of first die pad 31 and second die pad 32, the circumference of end portion 30a of a chip mounting surface is set up higher than the upper surface of chip 20 which is mounted.

It is because by setting up end portion 30a of the chip mounting surface of die pad 30 more highly than the topmost part of chip 20 in this way, even if stress which tears off chip 20 from the mounting surface of die pad 30 is applied to die pad 30, this stress is not promptly transmitted to chip 20 back surface side, but can be resisted at the end portion 30a which was formed highly. Guarantee of connection reliability is also aimed at by adopting this end portion 30a.

With this die pad 30, i.e., a first die pad 31, and second die pad 32, as shown in FIG. 4, mutual clearance is detached by the degree which does not cause a breakdown. For example, as for first die pad 31 and second die pad 32 at least, end portion 30a at which the circumference of a mounting surface became high needs to be detached at least 0.1 mm or more, though insulating resin intervened in between.

On the other hand, in semiconductor device 10, the bottom side is exposed from sealing body 40 like the explanation. Electric connection of a rear electrode, for example, a drain electrode can be performed now easily at the time of mounting of semiconductor device 10. In the tab exposing portion at the side of the bottom of semiconductor device 10 of this structure, resin of insulation does not intervene at this exposing portion. Therefore, at least, as shown in FIG. 4, as for between the exposed tabs, detaching 0.2 or more mm is called for.

In this semiconductor device 10, pin 51 for an output, first die pad 31, second die pad 32, and pin 52 for control are formed using lead frame 50 of the same one-sheet structure. For example, when shown in FIG. 1, lead frame 50 with same board thickness is used. As shown in FIGS. 2A and 2B, the thickness of pin 51 for an output, first die pad 31, second die pad 32, and pin 52 for control is set up identically.

However, in semiconductor device 10 shown in FIG. 1, not lead frame 50 of the same board thickness but lead frame 50 which formed die pad 30 portion more thickly than a lead part can also be used. The cross-sectional view at the time of using lead frame 50 of this structure was shown in FIG. 5A.

In FIG. 5A, lead frame 50 portion which forms die pad 30 (first die pad 31, second die pad 32) is formed more thickly than the lead 50a portion which forms pin 51 for an output, and pin 52 for control, respectively. That is, board thickness is thickly formed only for the portion corresponding to die pad 30 of lead frame 50.

Figure 5B:
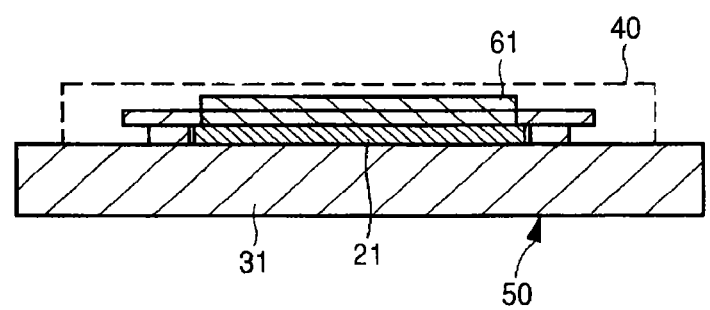

Incidentally, FIG. 5A shows the cutting situation in the A-A line of FIG. 1. The cross-sectional view showed the cutting situation in the B-B line to FIG. 5B schematically.

The cross-sectional view of N channel type trench gate MOSFET is shown in FIG. 6 as an example of a power transistor.

In MOSFET shown in FIG. 6, substrate (a semiconductor substrate) 201 which grew epitaxially n⁻ type single crystal silicon layer 201B on the front surface of n⁺ type single crystal silicon substrate 201A is used. Silicon oxide film 203 is formed in the front surface of substrate 201 by thermal oxidation.

On this silicon oxide film 203, the patterned silicon nitride film (illustration is omitted) is formed. A p type conductivity type impurity (for example, B (boron)) is injected into n⁻ type single crystal silicon layer 201B by using the silicon nitride film as a mask. It heat-treats, this impurity is diffused and p type well 205 is formed.

On the other hand, field insulating film 206 is formed in a region without the above-mentioned silicon nitride film. Field insulating film 206 is an element isolation region, and the region divided in this region turns into an element formation region (active region). Then, cleaning of substrate 201 using fluoric acid and cleaning of substrate 201 using heat phosphoric acid remove the above-mentioned silicon nitride film.

Next, the impurity ion (for example, B (boron)) which has a p type conductivity type is introduced into n⁻ type single crystal silicon layer 201B by using the patterned photoresist film as a mask. It heat-treats after that, impurity ion is diffused, and p⁻ type semiconductor region 207 is formed. This p⁻ type semiconductor region 207 constitutes a channel layer of power MOSFET.

The impurity ion (for example, As) which has an n type conductivity type is introduced into n⁻ type single crystal silicon layer 201B, using the patterned photoresist film as a mask. Subsequently, it heat-treats, impurity ion is diffused and n⁺ type semiconductor region 208 is formed. A part of this n³⁰ type semiconductor region 208 turns into the source region of power MOSFET.

A part of other n⁺ type semiconductor regions 208 is formed in a plane at the peripheral part of a chip when substrate 201 is divided to each semiconductor chip, and will have a function which protects the power MOSFET element.

Silicon oxide film 203 and substrate 201 are etched by using the patterned photoresist film as a mask, and trench 210 is formed. Then, thermal oxidation film 211 is formed in the bottom and side wall of trench 210 by heat-treating to substrate 201. This thermal oxidation film 211 turns into a gate insulating film of power MOSFET.

Next, the polycrystalline silicon film with which P was doped is deposited on silicon oxide film 203 comprising the inside of trench 210, and trench 210 is embedded by the polycrystalline silicon film. At this time, a polycrystalline silicon film is formed in layers on silicon oxide film 203 on p type well 205.

Then, the polycrystalline silicon film is etched by using the patterned photoresist film as a mask, and it leaves a polycrystalline silicon film in trench 210. By it, gate electrode 212 of power MOSFET is formed in trench 210.

In this case, also on silicon oxide film 203 of the peripheral part of a chip area, and field insulating film 206, it leaves a polycrystalline silicon film and polycrystalline silicon pattern 213 is formed. A part of polycrystalline silicon patterns 213 and gate electrode 212 are electrically connected in the region which is not illustrated.

Thus, power MOSFET which makes a drain region n⁺ type single crystal silicon substrate 201A and n-type single crystal silicon layer 201B, and makes n⁺ type semiconductor region 208 the source region can be formed.

Next, for example, after depositing a PSG (Phospho Silicate Glass) film on substrate 201, a SOG (Spin On Glass) film is applied on the PSG film, and insulating film 216 which consists of a PSG film and a SOG film is formed.

Then, insulating film 216 and substrate 201 are etched by using the patterned photoresist film as a mask, and contact trenches 217 and 218 are formed. Contact trench 217 is formed so that n⁺ type semiconductor region 208 which turns into the source region between adjoining gate electrodes 212 may be penetrated. At this time, insulating film 216 on polycrystalline silicon pattern 213 is also patterned, and contact trench 219 which reaches polycrystalline silicon pattern 213 is formed.

$BF_2$ (2 boron fluoride) is introduced from the bottom of contact trenches 217 and 218 as impurity ion which has a p type conductivity type, for example. p⁺ type semiconductor region 220 which covers the bottom of contact trenches 217 and 218 is formed. This p⁺ type semiconductor region 220 is for doing ohmic contact of the wiring formed at a later step with p⁻ type semiconductor region 207 at the bottom of contact trench 217.

Next, barrier conductor film 222 is formed in the upper part of insulating film 216 comprising the inside of contact trenches 217-219. What is necessary is to deposit a TiW (titanium tungsten) film thinly by the sputtering method, and just to heat-treat substrate 201 after that as this barrier conductor film 222, for example.

Subsequently, on substrate 201, a photoresist film is formed and this photoresist film is patterned. Then, conductive film 225 is formed by depositing Al film on the region to which a photoresist film does not exist by a sputtering technique. Then, a UBM layer is thinly formed on conductive film 225 with Ni etc.

Next, after removing a photoresist film, barrier conductor film 222 of the region where conductive film 225 does not exist in a plane is etched. Wirings 226, 227, and 228 which consist of conductive film 225 and barrier conductor film 222 are formed.

Wiring 227 turns into gate wiring electrically connected with gate electrode 212 via polycrystalline silicon pattern 213. Wiring 226 is arranged at a plane at the peripheral part (second semiconductor substrate region) of a chip, after dividing substrate 201 to each chip. Wiring 226 electrically connects with n+ type semiconductor region 208 formed in the peripheral part of a chip, and is maintained at the same electric potential as a drain at the time of the drive of power MOSFET.

Next, for example, silicon nitride film 231 is deposited on substrate 201 with plasma CVD method etc., then polyimide resin film 232 is deposited on the silicon nitride film 231. Polyimide resin film 232 may be whichever of photosensitivity or non-photosensitivity.

Then, polyimide resin film 232 and silicon nitride film 231 are etched one by one by using the patterned photoresist film as a mask. Opening 233 is formed on wiring 228 which is a source electrode, and it leaves polyimide resin film 232 and silicon nitride film 231 to the other region.

According to the step so far, bump ground film 236 which consists of barrier conductor film 222, and conductive film 225 including a UBM layer can be formed. Wiring 228 can be made to have a function as a source electrode (wiring), and a function as a bump ground film. What is necessary is to form Au film on wiring 228, and just to prevent the surface oxidation of conductive film 225 which forms wiring 228, by the time a bump electrode is formed.

Next, after protecting the front surface of substrate 201 by a tape etc., a protection surface is made into a lower part and the back surface of n+ type single crystal silicon substrate 201A is ground. On the back surface of n+ type single crystal silicon substrate 201A, as a conductive film, Ti (titanium) film 237, Ni film 238, and Au film 239 are evaporated one by one, for example, and a laminated film is formed. This laminated film functions as lead-out electrode (drain electrode) 240 of a drain region.

Then, the soldering paste which consists of Ag (silver), Sn (tin), and Cu (copper) is printed using the metal mask (illustration is omitted) aligned with the plane pattern of the opening 233, and opening 233 is embedded. Bump electrode 241 of about thickness 150 μm electrically connected with wiring 228 is formed. Flat electrode 61 previously stated is formed to the bump electrode of this structure.

This bump electrode 241 and wiring 228 constitute a source electrode which is a main surface electrode of power MOSFET. Then, dicing of the substrate 201 of a wafer state is done along a division region, and first chip 21 is formed.

Figure 7:
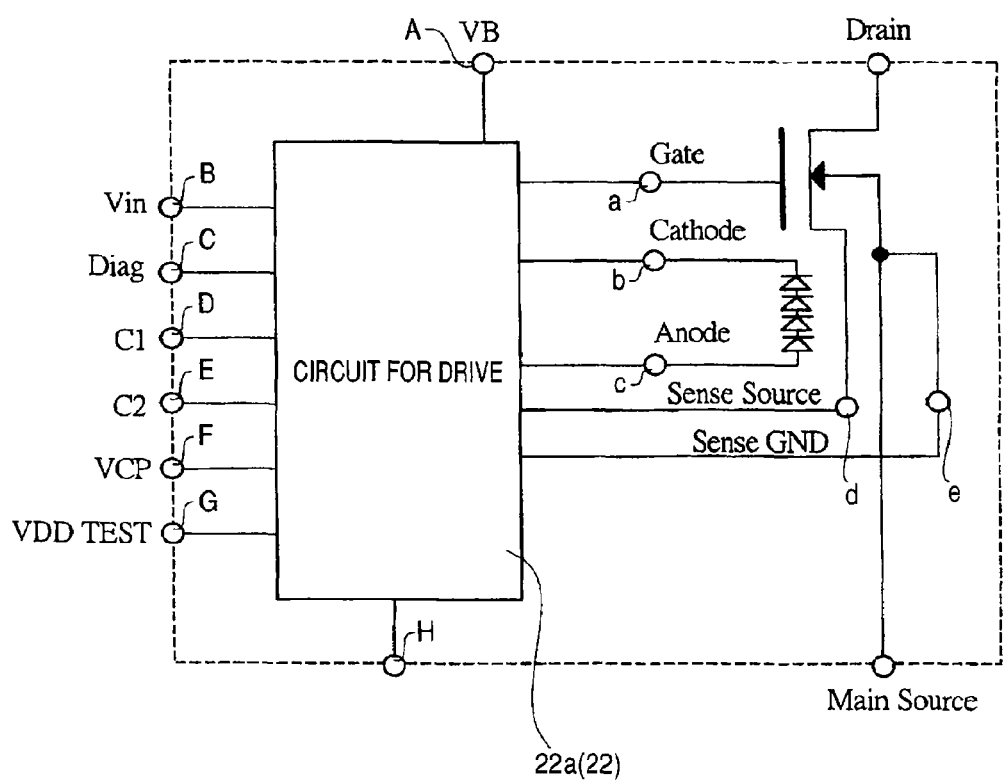
FIG. 7 is a circuit diagram showing the circuit configuration in a semiconductor device.

FIG. 7 is an equivalent circuit block diagram of this semiconductor device. As shown in FIG. 7, Gate terminal a, Cathode terminal b, Anode terminal c, SenseSource terminal d, and SenseGND terminal e are formed in the first chip 21 side of semiconductor device 10, respectively. VB terminal A, Vin terminal B, Diag terminal C, C1 terminal D, C2 terminal E, VCP terminal F, VDDTEST terminal G, and GND terminal H of the circuit for a drive are formed in the second chip 22 side, respectively, and circuit 22a for a drive is formed. The driving signal outputted from circuit 22a for a drive is inputted into Gate terminal a of power transistor 21a, and turn-on/turn-off of the power transistor 21a is done.

Figure 8:
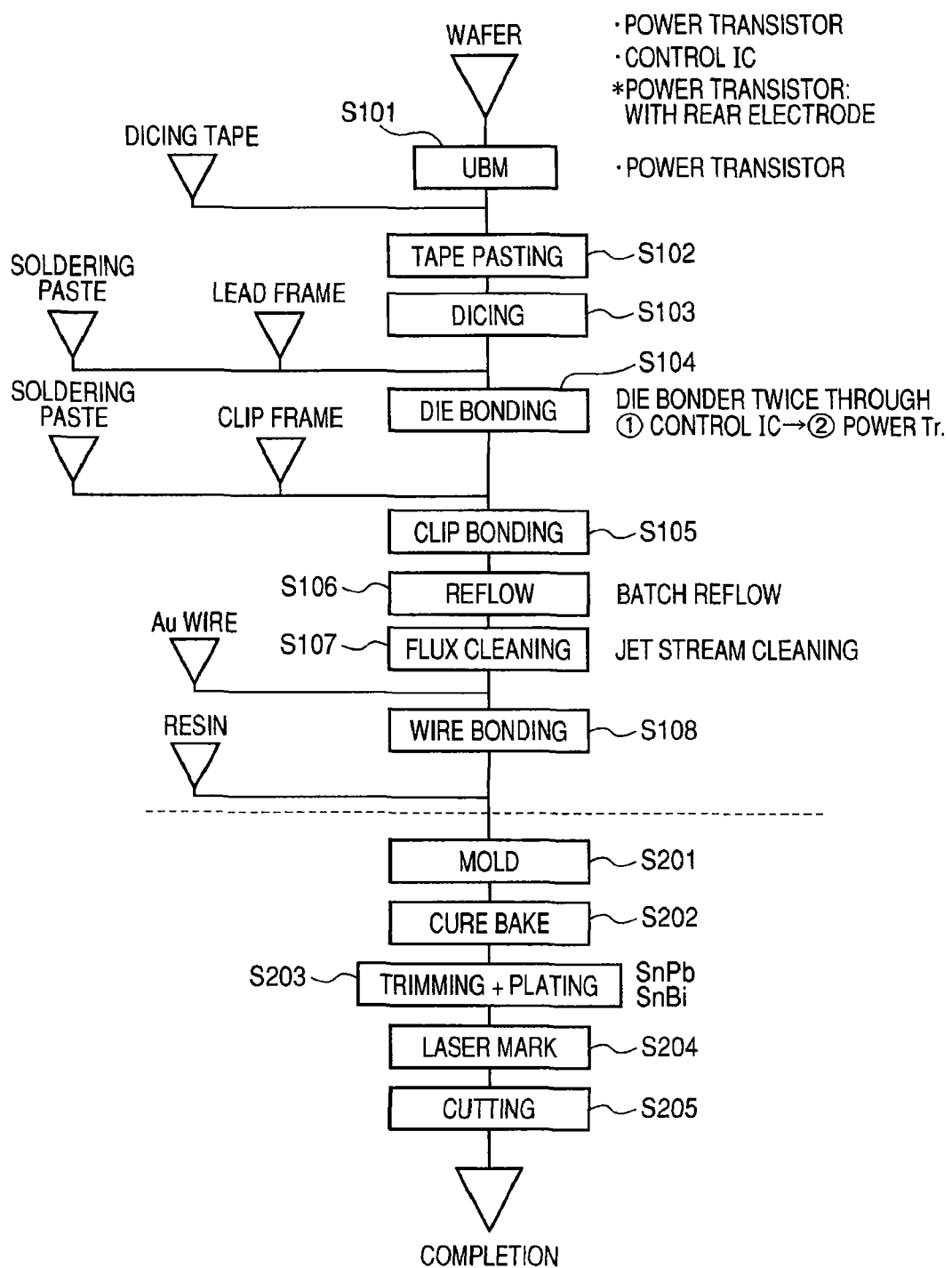
FIG. 8 is a flow diagram showing the manufacture procedure of a semiconductor device.

This semiconductor device 10 is manufactured through each step of a flow diagram as shown in FIG. 8, for example. That is, at Step S101 of FIG. 8, the wafer made to the stage before individually separating by dicing is supplied, for example. The pad electrode of aluminum is formed in the chip directly before this individual separation, for example, and a under bump metal (UBM) is given on this electrode pad. What is necessary is just to use Ni, Ti, etc. as this UBM, for example.

Then, a dicing tape is stuck on a wafer back surface at Step S102 using the supplied dicing tape. At Step S103, dicing of the wafer is done and a chip is individually separated. In semiconductor device 10 explained by this embodiment, as shown in FIG. 1, first chip 21 and second chip 22 are formed. Therefore, the step from the above-mentioned step S101 to Step S103 is performed by first chip 21 and second chip 22, respectively.

Die bonding of the chip individually separated by dicing in this way is done on the die pad of a lead frame by Step S104 using the soldering paste and the lead frame which were supplied. In semiconductor device 10 of this embodiment, since two chips are mounted like the above, die bonding is performed twice. For example, what is necessary is to do die bonding of the second chip 22, and just to do die bonding of the first chip 21 after that. As for two chips, a rear electrode is connected to a die pad by this die bonding.

Then, clip bonding is performed at Step S105 using the supplied soldering paste and the clip frame for flat electrodes. By this clip bonding, the electrode formed in the main surface of first chip 21 and pin 51 for an output will be connected. Then, it heats to prescribed temperature at Step S106, batch reflow is performed, and the bonding by the soldering paste is completed.

After bonding is completed, the solder flux is cleaned by jet stream cleaning etc. at Step S107. Then, supplied Au wire performs wire bonding at Step S108. By this wire bonding, each of first chip 21 and second chip 22, and second chip 22 and pin 52 for control is electrically connected.

Then, a mold is performed at Step S201 using the supplied resin. Sealing body 40 is formed of this mold, and semiconductor device 10 of the above-mentioned structure is sealed. Cure bake is done at Step S202 after a mold. It takes out from a metallic mold, and trimming is performed at Step S203, and plating treatment is carried out to the necessary place of a lead part.

A laser mark is attached at Step S204 after plating treatment, it cuts at Step S205, individual separation of semiconductor device 10 is performed, and it becomes completion of semiconductor device 10.

With the molding step of the step S201 in these manufacturing processes of a series of, in semiconductor device 10 of this embodiment, like the explanation, the mold of a part of first die pads 31 and second die pads 32 is done so that it may expose out of sealing body 40, respectively.

As for the exposure situation from sealing body 40 of this first die pad 31, like the above, as shown in FIG. 1, exposing portion 33 (portion which indicated by the slash among the drawing as intelligibly) which is a part of side surface of first die pad 31 and second die pad 32 is exposed from sealing body 40.

As shown in FIG. 1, on the other hand, as for first die pad 31, when it sees on the basis of the side of this sealing body 40, the first end-face 31a portion of first die pad 31 parallel to third side 43 which crosses first side 41 and second side 42 of sealing body 40 is settled so that it may be located in sealing body 40.

Figure 9A:
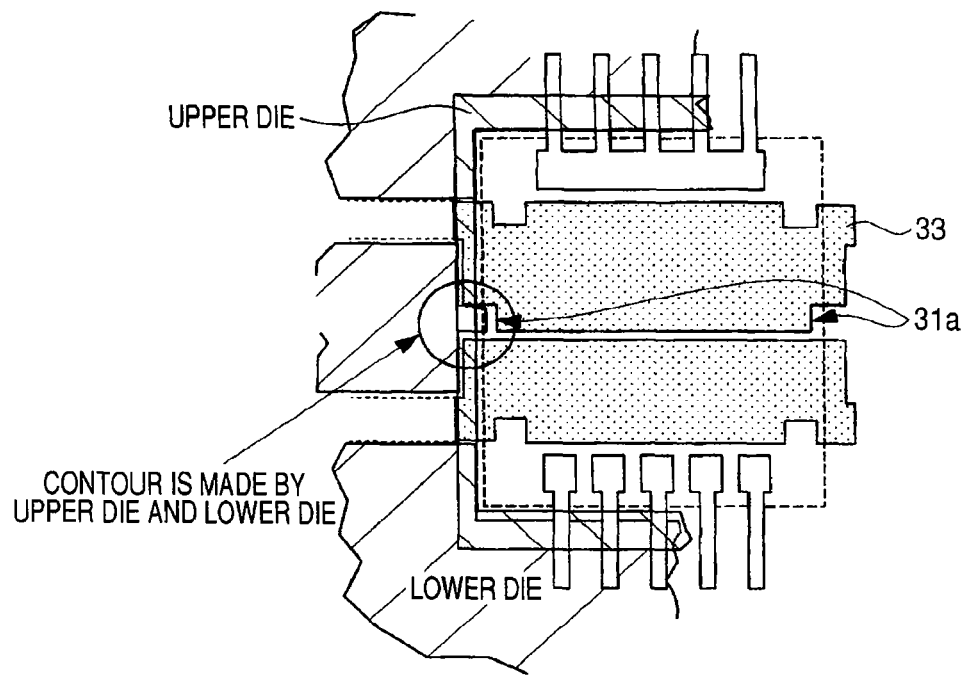
FIGS. 9A, 9B, and 9C are the explanatory diagrams explaining the mold situation of the semiconductor device in the present invention.
Figure 9B:
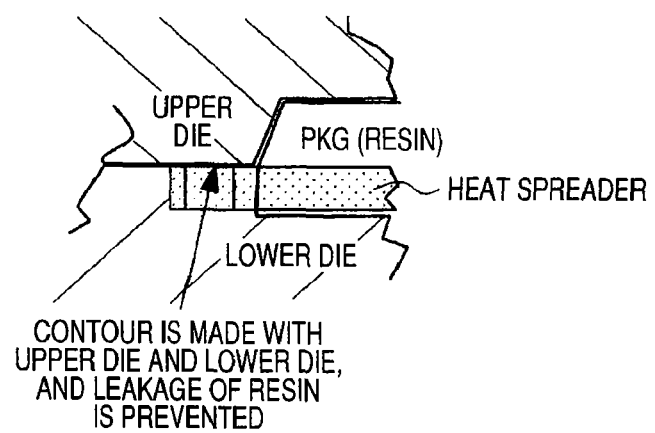

That is, as shown in FIG. 9A, at the time of molding, when sealing exposing portion 33 of first die pad 31 and second die pad 32 in the state where it pressed down with the upper die and lower die of the metallic mold, a first end-face 31a portion enters inside from the range pressed down with the upper die and the lower die. Therefore, since the contour of the sealing mold by resin can be firmly made with an upper die and a lower die as shown in FIG. 9B as a part drawing, there is no possibility that the resin to seal may leak.

Figure 9C:
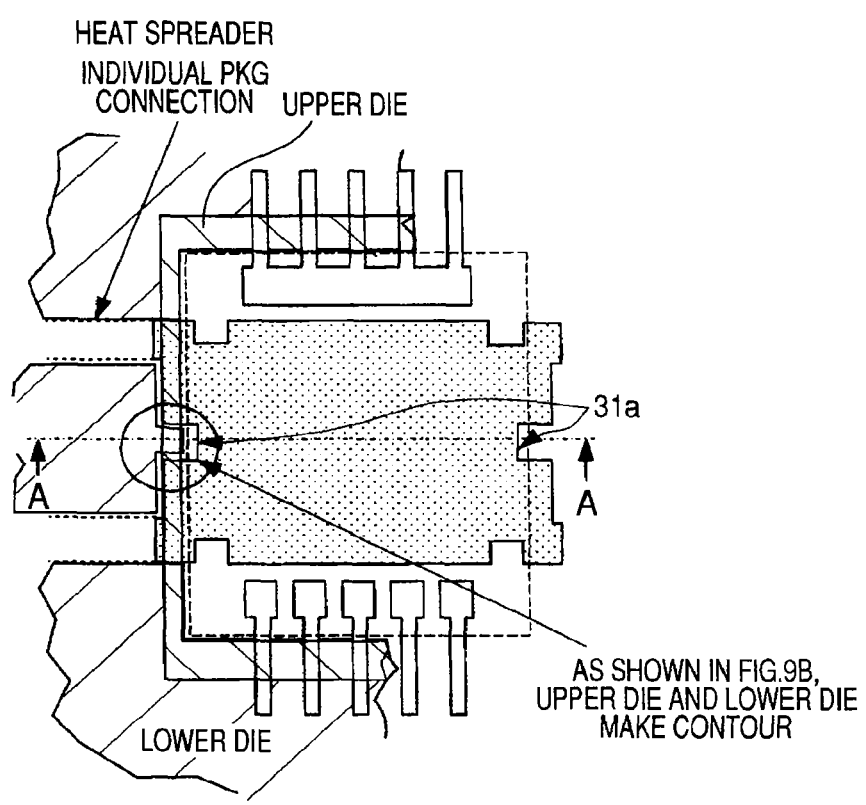

This structure can be applied also when it is the one-sheet structure which first die pad 31 and second die pad 32 were not divided, but was connected. That is, as shown in FIG. 9C, also in one-sheet structure, the mold can be done with the same metallic mold.

Figure 10A:
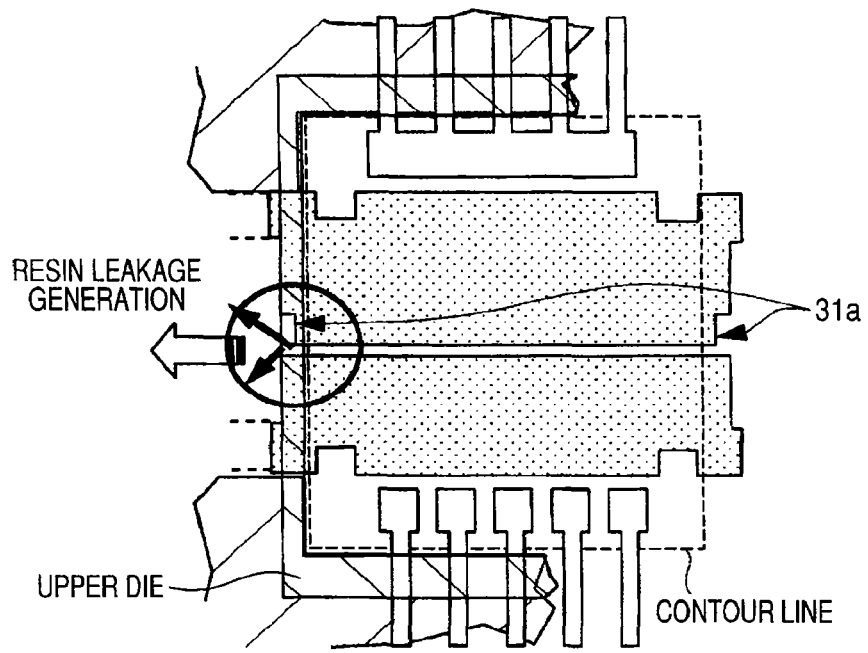
FIGS. 10A, 10B, and 10C are the explanatory diagrams explaining the mold situation of the semiconductor device of structure of that the present inventions differ.
Figure 10B:
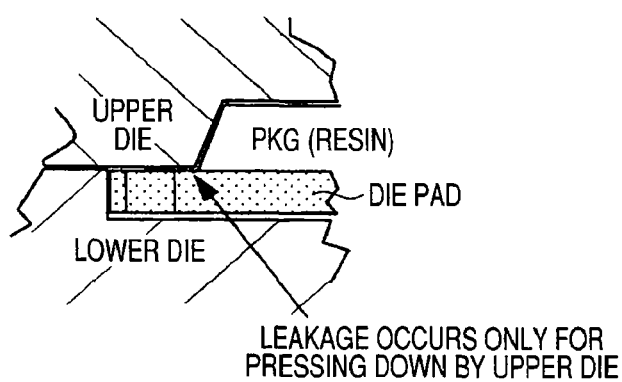

However, in the case where first end face 31a is shallowly formed at the dividing part of first die pad 31 and second die pad 32 unlike FIG. 9A so that it may come out of sealing body 40 as shown in FIG. 10A, bite of the upper die and lower die in this part cannot be performed well, but the leakage of sealing resin generates it. The state was schematically shown in FIG. 10B.

Figure 10C:
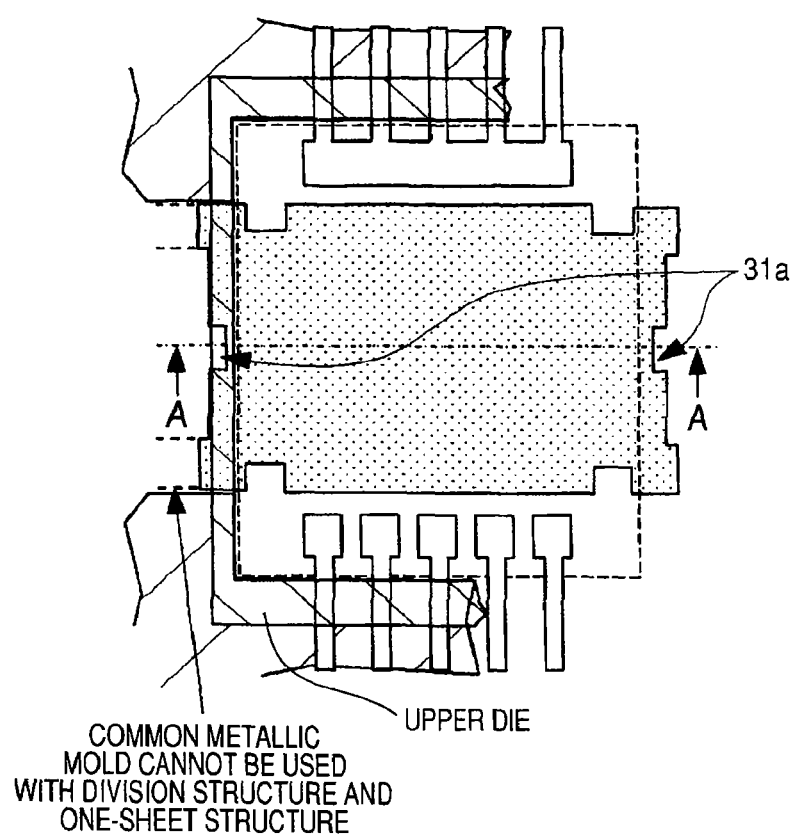

Using the same metallic mold, when the first end-face 31a portion is formed shallowly in this way, as shown in FIG. 10C, the mold of the thing of one-sheet structure of a die pad and the thing by which division structure was done cannot be performed, and communalization of a metallic mold cannot be performed.

Thus, a cut of first end face 31a needs to form deeply so that the contour at the time of resin sealing may be formed without a clearance from an upper die and a lower die.

Since two chips are mounted in one package in semiconductor device 10 of the present invention formed as mentioned above, compared with the case where a package is formed for every each chip, a miniaturization can be aimed at, for example, the mounting area at the time of mounting can be made small. Since the chip is mounted in the same package, loss with the wiring between packages can also be reduced.

(Embodiment 2)

This embodiment explains the case where the metal mold used when division structure of the die pad is done can perform a mold, even the die pad of one-sheet structure by forming the cut of first end face 31*a* deeply, as the Embodiment 1 described.

With the division structure of die pad 30, it is important like the above to form a cut of first end face 31*a* deeply. However, even if it uses the metallic mold used at the time of this division structure, sealing body 40 suitable enough can be formed by applying to die pad 30 of one-sheet structure.

For example, although division structure of the die pad 30 is not done when shown in FIG. 11, first end face 31*a* is deeply formed so that it may enter inside sealing body 40. Chip 21*a* is mounted on this die pad 30, and the source electrode is connected with flat electrode 61 to lead 50*a* formed in the pin for an output etc. A gate electrode is also connected to lead 50*b* not with wire connection but with flat electrode 61, and it has a wireless structure.

Figure 11A:
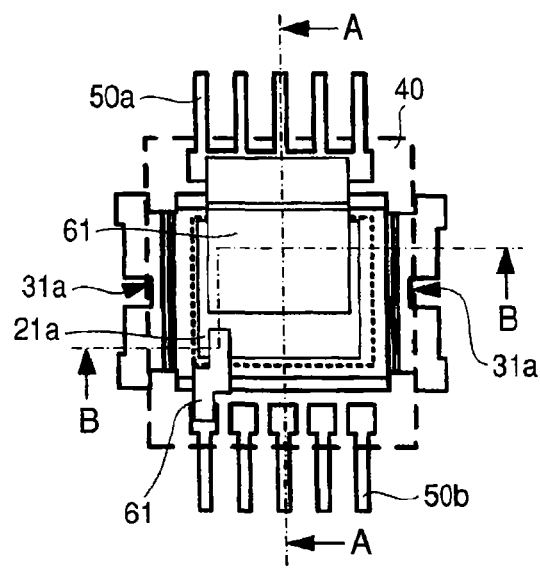
FIGS. 11A to 11E are explanatory diagrams showing the structure of the semiconductor device relevant to the present invention.
Figures 11B, 11C:
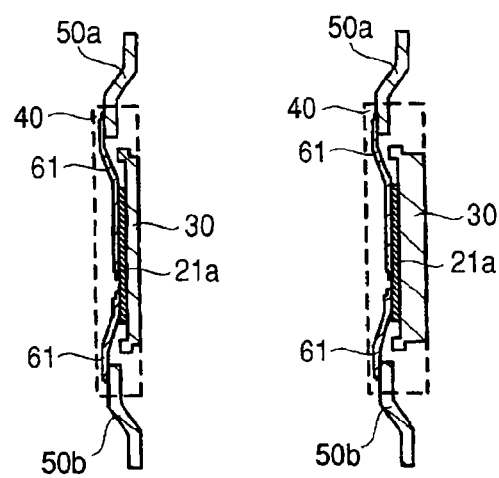
Figure 11D:
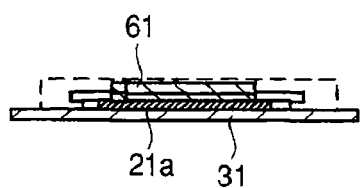
Figure 11E:
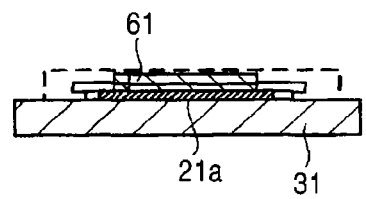
Figure 11F:
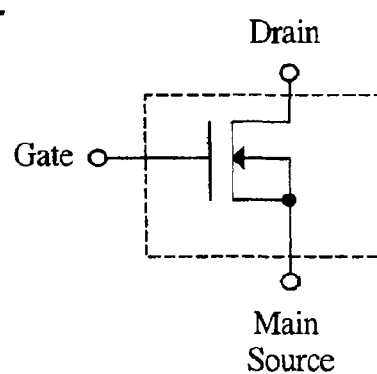
FIG. 11F is the circuit diagram.

With this structure, by the same lead frame 50, leads 50*a* and 50*b* and die pad 30 are formed, and board thickness is formed identically. This case was shown in FIGS. 11B and 11D. It can also be formed using lead frame 50 of structure with thick die pad 30 portion, and the example was shown in FIGS. 11C and 11E. In this semiconductor device, the circuit configuration as shown in FIG. 11F is adopted, for example.

(Embodiment 3)

Figure 12A:
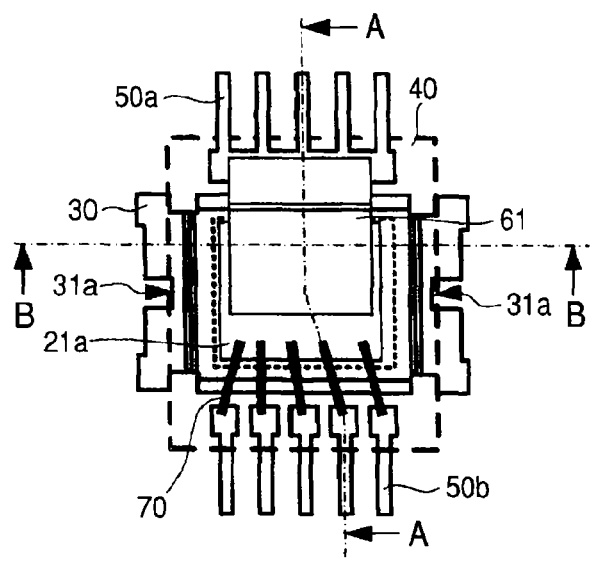
FIGS. 12A to 12E are explanatory diagrams showing the structure of the semiconductor device relevant to the present invention.

This embodiment explains other examples by which division structure of the die pad 30 is not done like the Embodiment 2. As shown in FIG. 12A, the case where chip 21*a* which is MOSFET, for example is mounted on die pad 30 can be mentioned. Also by this case, since first end face 31*a* of die pad 30 is deeply formed as the metallic mold sealing described, resin leakage can be prevented at the time of a mold, and sealing body 40 can be formed in sufficient accuracy.

As for chip 21*a*, the source electrode is connected with lead 50*a* by flat electrode 61 with this structure. By wire bonding, the gate electrode is connected to lead 50*b* with wire 70. Al or Au is used for wire 70, for example. In this structure, using the same lead frame 50, leads 50*a* and 50*b* and die pad 30 are formed so that board thickness may become the same.

Figures 12B, 12C:
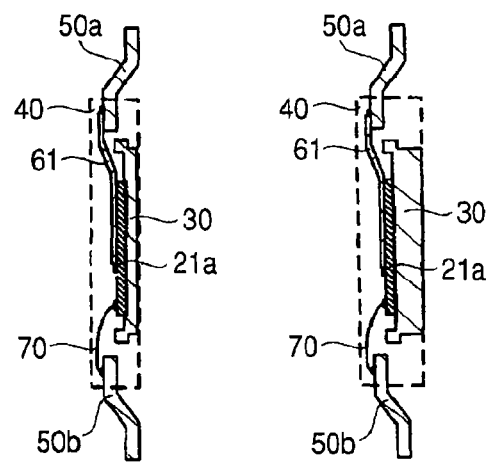
Figure 12D:
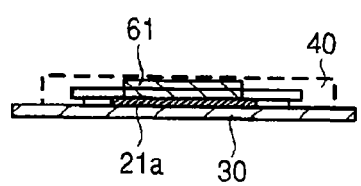
Figure 12E:
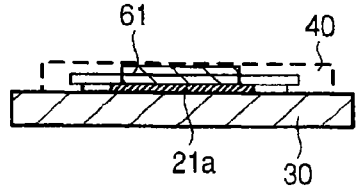
Figure 12F:
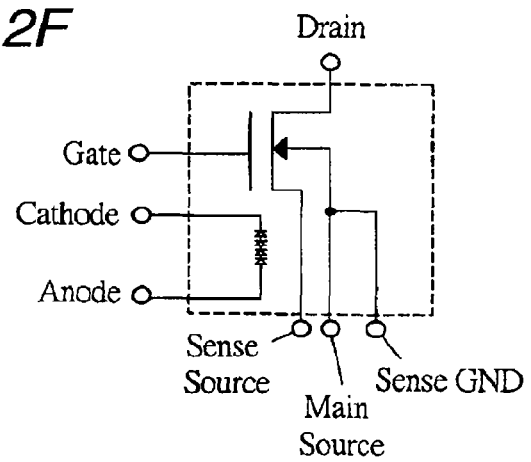
FIG. 12F is a block diagram showing the circuit configuration.

The case where lead frame 50 with same board thickness was used was shown in FIGS. 12B and 12D. Even if it uses lead frame 50 in which the board thickness for a die pad part was formed thickly, it can form, as shown in FIGS. 12C and 12E. In the case where it is shown in FIG. 12A, as a circuit configuration is shown in FIG. 12F, it is the example by which chip 21*a* is formed in MOSFET which built in the diode with a temperature detection sensor, for example.

(Embodiment 4)

Figure 13A:
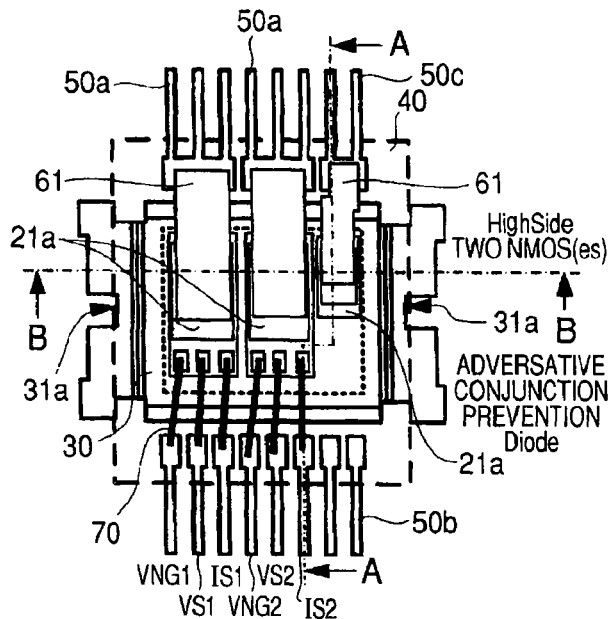
FIGS. 13A to 13E are explanatory diagrams showing the structure of the semiconductor device relevant to the present invention.

In this embodiment, other examples of semiconductor device 10 with which first end face 31*a* is formed in die pad 30, and this first end face 31*a* is included inside sealing body 40 are given like the Embodiment 2. As shown at FIG. 13A in this case, chip 21*a* which are two N-channel MOS FET, and chip 21*b* which is a diode are mounted on die pad 30.

As for two chips 21*a*, the source electrode is connected to lead 50*a* by flat electrode 61. The gate electrode is also connected to lead 50*b* by wire 70. Chip 21*b* is also connected to lead 50*c* by flat electrode 61. In this structure, board thickness is identically formed using lead frame 50 with same leads 50*a*, 50*b*, and 50*c* and die pad 30.

Figures 13B, 13C:
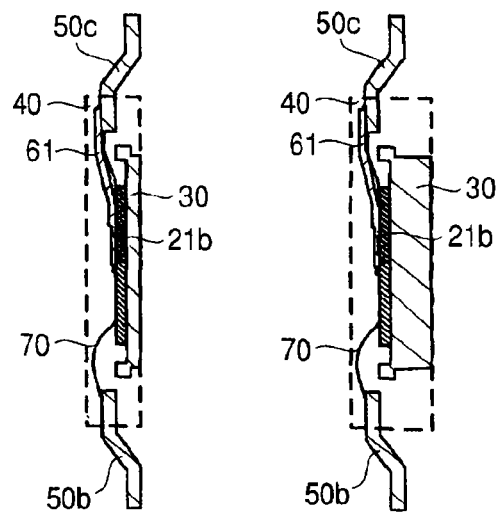
Figure 13D:
Figure 13E:
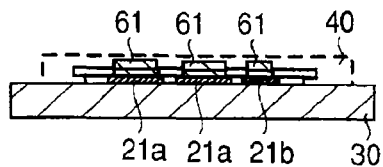
Figure 13F:
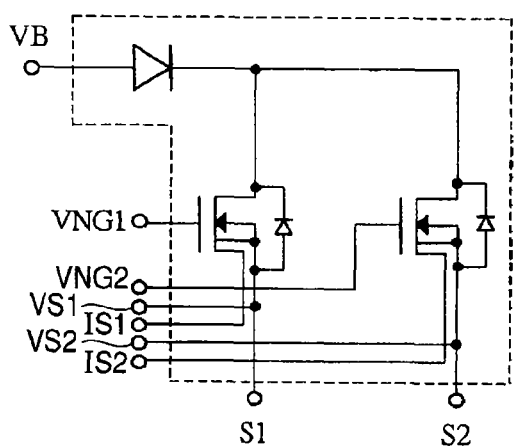
FIG. 13F is a block diagram showing the circuit configuration.

This case was shown in FIGS. 13B and 13D. Even if it uses lead frame 50 which formed the board thickness for a die pad part more thickly than a lead part, as shown in FIGS. 13C and 13E, it can form similarly. When shown in FIG. 13A, as a circuit configuration is shown in FIG. 13F, the adversative conjunction prevention diode is used, for example.

(Embodiment 5)

Figure 14:
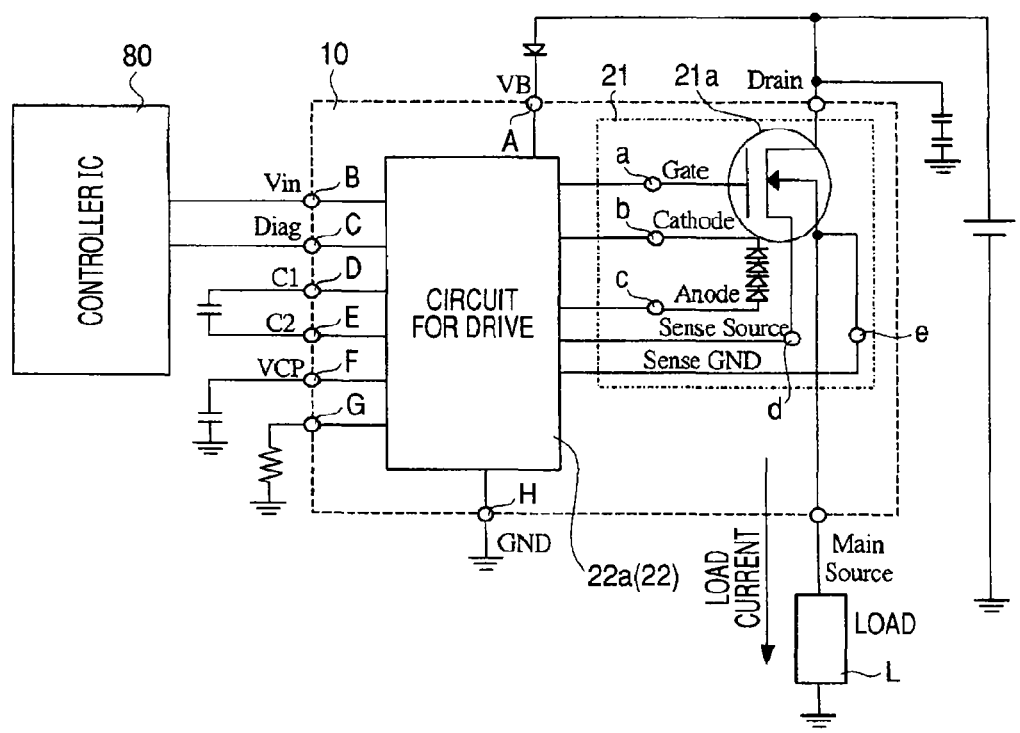
FIG. 14 is a circuit diagram showing an example of the circuit configuration at the time of mounting of the semiconductor device of the present invention.

This embodiment explains the mounting form of semiconductor device 10 explained by the Embodiment 1. Semiconductor device 10 is electrically connected with controller IC 80 and used, as shown in the circuit block picture of FIG. 14.

That is, semiconductor device 10 is controlled by the control signal outputted from controller IC 80. Circuit 22*a* for a drive which received the control signal from controller IC 80 generates the signal for a drive. Load L connected to power transistor 21*a* is driven because this signal for a drive is inputted into the input terminal of power transistor 21*a* (power MOSFET) and power transistor 21*a* does turn-on turn-off.

In circuit 22*a* for a drive, when the signal from the temperature sensor built in first chip 21 is received and excessive temperature is detected, power transistor 21*a* is turned OFF. On the other hand, circuit 22*a* for a drive detects the overcurrent of load L by detecting the current of current mirror MOSs whose cells are few by a certain ratio to power transistor 21*a* built in first chip 21, and it controls so that the current beyond constant value does not flow by controlling the gate of MOSFET.

Circuit 22*a* for a drive of this structure detects the above-mentioned excessive temperature, and power transistor 21*a* is turned OFF, or when abnormalities occur in the function by the gate control of power transistor 21*a* to keep the current beyond constant value from flowing, a diagnosis signal can be taken out and an abnormality occurance can be informed to controller IC 80.

As for semiconductor device 10, the pin 51 for an output and pin 52 for control are taken out from the counter direction face to face. Therefore, the vertical arrangement of the arrangement configuration of semiconductor chip 10 is attained so that each lead direction made to project may gather to controller IC 80, namely, as shown in FIG. 15.

Figure 15:
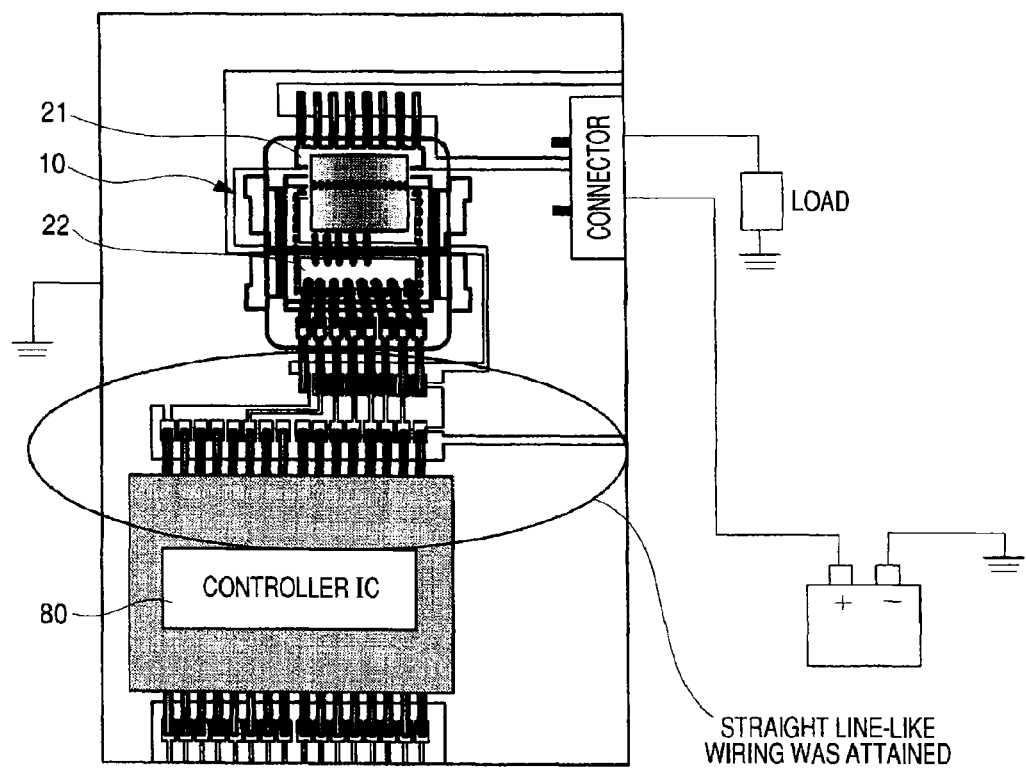
FIG. 15 is an explanatory diagram showing an example of the wiring structure at the time of mounting of the semiconductor device of the present invention.

With forming in this vertical arrangement, as with a circle surrounds and shows to FIG. 15, the wire length of second chip 22 comprising circuit 22*a* for a drive of semiconductor device 10 and controller IC 80 can be set as the shortest straight line-like wiring, for example. Since it becomes possible when mounting to wire the shape of shortest straight line in this way, unlike a conventional case with a long wire length, a circuit configuration strong against a noise etc. can be performed. 1 layer wiring is possible for this wiring, it can differ in an old case as a wiring may become entangled intricately, and it can avoid the complicatedness formed in multilayer interconnection.

Figure 16:
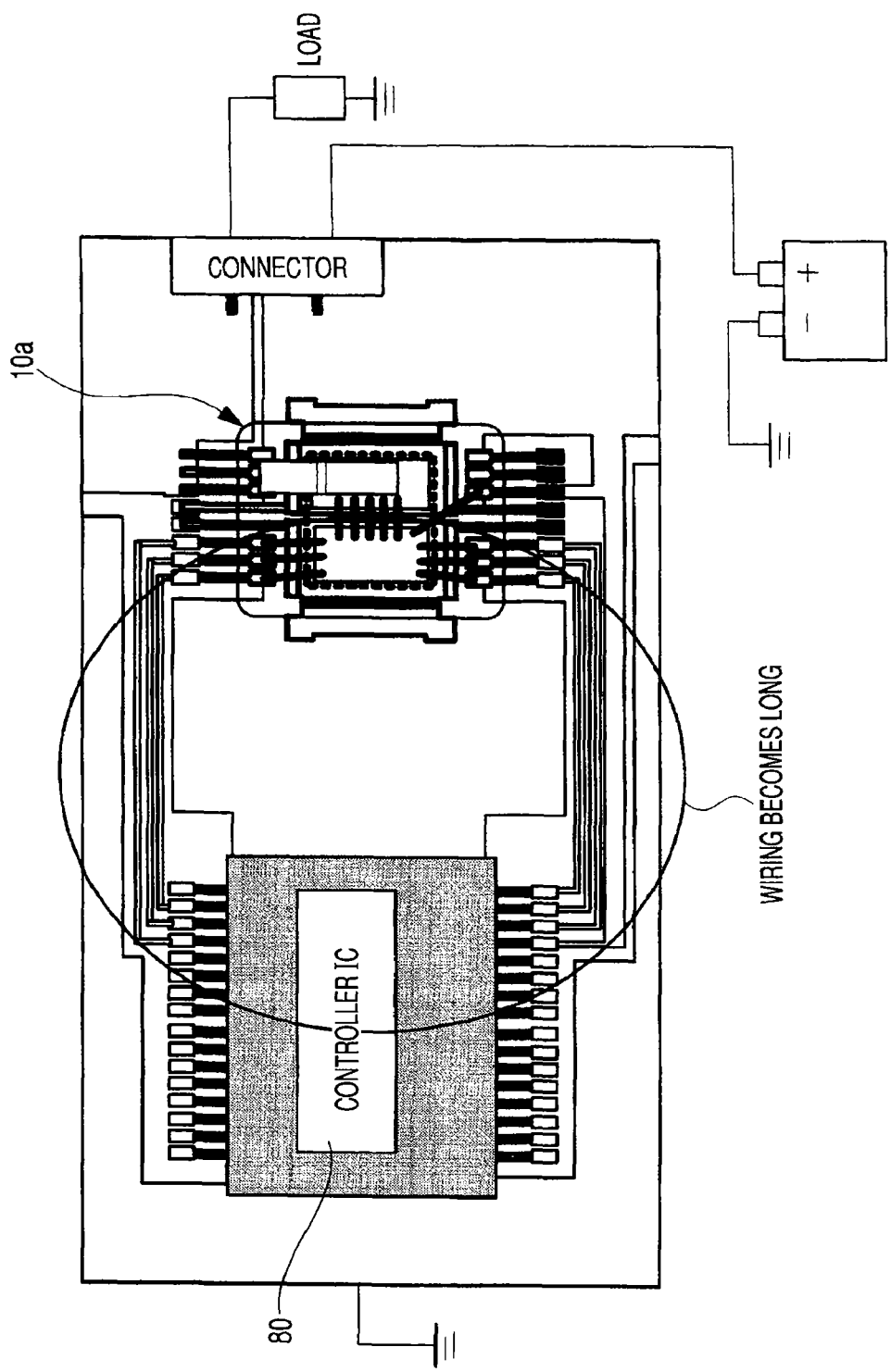
FIG. 16 is an explanatory diagram showing an example of the wiring structure at the time of mounting of a conventional semiconductor device.

In the circuit configuration of the conventional mounting wiring, semiconductor device 10*a* differs in semiconductor device 10 of this embodiment, and the pin for an output and the pin for control were located in a line on the same side. Therefore, as shown in FIG. 16, when mounting, controller IC 80 and semiconductor device 10*a* must perform parallel arrangement. Therefore, as a circle of FIG. 16 surrounds and shows, the wiring which ties both controller IC 80 and semiconductor device 10*a* must wire with a long length in a horizontal direction, and the wire length was long. Depending on the case, multilayer interconnection may be needed.

However, in semiconductor device 10 of the present invention, as shown in FIG. 1, first chip 21 and second chip 22 are mounted in first die pad 31 and second die pad 32 which were separated. And pin 51 for an output and pin 52 for control have projected from the opposite side which faced. Therefore, mounting by vertical arrangement as shown in FIG. 15 can be performed, without adopting conventional arrangement as shown in FIG. 16. The increase in efficiency of a mounting wiring can be aimed at by this structure.

In conventional semiconductor device 10a, as shown in FIG. 16, the wire length was long. Of course, although it is also possible to wire in a short distance using conventional semiconductor device 10a, in this case, it is necessary to form a wiring in a multilayer etc. A wiring layout is complicated further and becomes less practical.

(Embodiment 6)

As for the wiring for power supplies, and the wiring for loads, in semiconductor device 10 of structure of that the embodiment described, a wiring layout which is called BUS-BAR and which can process a plurality of semiconductor devices 10 collectively may be adopted when mounting, for example.

With the layout structure which adopts this BUS-BAR, semiconductor device 10 described by the embodiment becomes advantageous again compared with conventional semiconductor device 10a.

Figure 17:
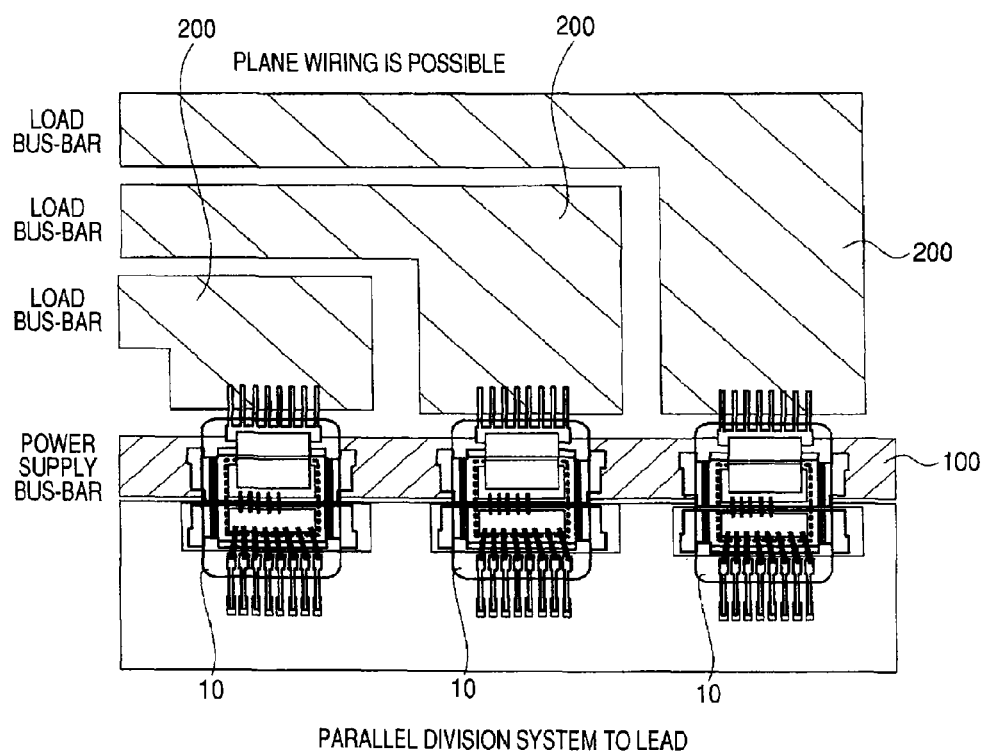
FIG. 17 is an explanatory diagram showing the state of a BUS-BAR wiring at the time of mounting of the semiconductor device of the present invention.

That is, as shown in FIG. 17, BUS-BAR 100 for power supplies is made into the shape of a straight line, on this BUS-BAR 100 for power supplies, the projection direction of pin 51 for an output can be arranged, and parallel arrangement of each semiconductor devices 10 of a plurality of can be done in a horizontal direction. To the direction of a line of BUS-BAR 100 for power supplies, each semiconductor device 10 makes the pin for an output project in the intersection direction, and parallel arrangement is done.

In this semiconductor device 10 of each by which parallel arrangement was done, pin 51 for an output will be connected to BUS-BAR 200 for loads every semiconductor device 10. As this BUS-BAR 200 for loads is shown in FIG. 17, it is not necessary to make it cross mutually, and 1 layer plane wiring of BUS-BAR 200 for loads becomes possible.

Figure 18:
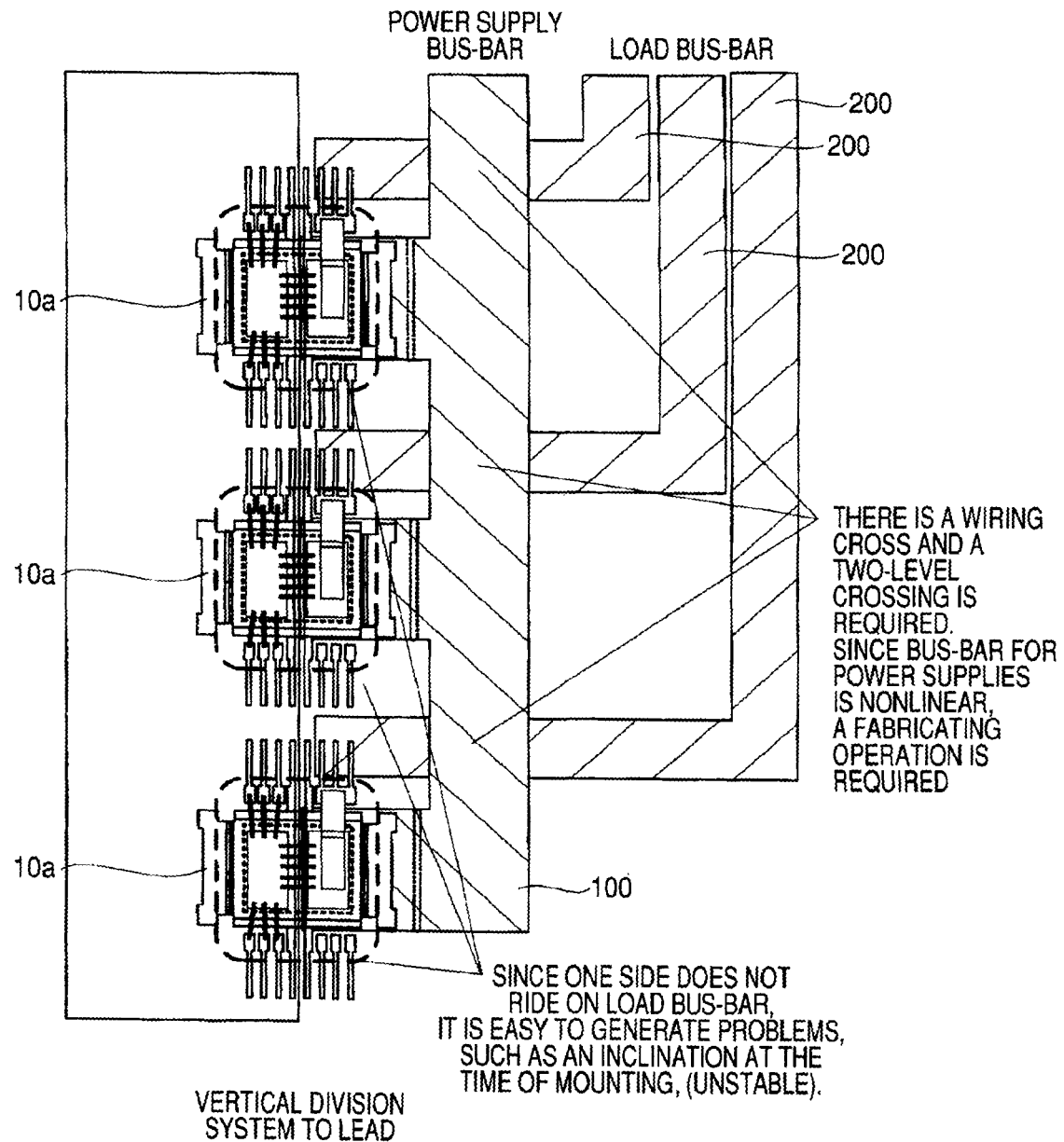
FIG. 18 is an explanatory diagram showing the state of a BUS-BAR wiring at the time of mounting of a conventional semiconductor device.

However, in conventional semiconductor device 10a, the pin for an output and the pin for control have projected from the same side side. It is necessary to arrange the side out of which each pin for an output has come, and as shown in FIG. 18, it is necessary to arrange so that each semiconductor device 10a may be located in a line with a longitudinal direction. BUS-BAR 100 for power supplies is formed in parallel to the shape of a straight line to the pin for an output, and branches a horizontal direction to each semiconductor device 10a side on it, and the feeding power of it has become possible for each semiconductor device 10a on the occasion of this arrangement.

On the other hand, BUS-BAR 200 for loads is made into the shape of a straight line to a plurality of pins for an output of each semiconductor device 10a, and a plurality of pins for an output can connect it to the same BUS-BAR 200 for loads. Therefore, as for BUS-BAR 200 for loads, as shown in FIG. 18, the part which is crossed with BUS-BAR 100 for power supplies on a wiring surely occurred and a two-level crossing is needed in this part.

Thus, even in the case of a BUS-BAR wiring, in semiconductor device 10 described by the Embodiment 1, a wiring layout becomes very easy compared with conventional semiconductor device 10a without this array constitution.

In conventional semiconductor device 10a, the pin for an output was made to project to the same side with the pin for control, and, as for the pin for control, this pin for an output was divided into the counter direction. Therefore, as for the pin for an output, only one side is connected to BUS-BAR200 for loads in above-mentioned BUS-BAR200 for load, and the pin for an output of the other will be in the free state where it does not connect. Therefore, the unstable state where an inclination etc. occurs easily may occur at the time of mounting.

(Embodiment 7)

The Embodiment 6 described a predominance in the BUS-BAR wiring at the time of using semiconductor device 10 explained by the Embodiment 1. However, improvement in the heat radiation property of semiconductor device 10 can also be aimed at using a BUS-BAR wiring.

Figure 19A:
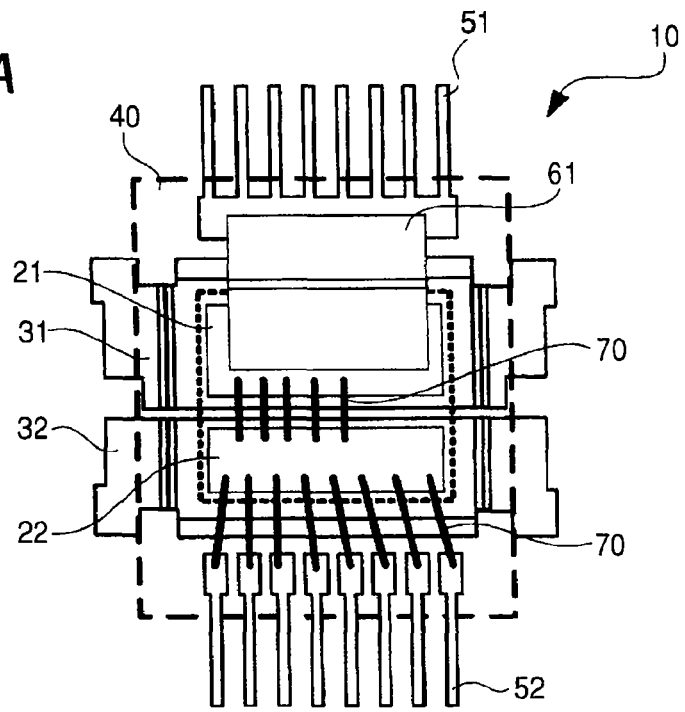
FIG. 19A is a plan view showing the plane structure of the semiconductor device concerning the present invention.

For example, when shown in FIG. 19A, as for semiconductor device 10, like the Embodiment 1, first chip 21 is mounted on first die pad 31, and second chip 22 is mounted on second die pad 32. This first die pad 31 and second die pad 32 are divided in the direction in parallel with first side 41 and second side 42 of sealing body 40, and are formed independently.

As shown in FIG. 19A, pin 51 for an output of first chip 21 is projected from the first side 41 side of sealing body 40, and is connected with the electrode formed in first chip 21 main surface by flat electrode 61. Flat electrode 61 is exposed from the upper surface of sealing body 40, and the exposed surface of this flat electrode 61 is connected to BUS-BAR 200 for loads.

The back surface side of first die pad 31 and second die pad 32 is exposed from sealing body 40 and is also connected to BUS-BAR 100 for power supplies.

Both first chip 21, second chip 22, and second chip 22 and pin 52 for control are connected with wire 70 by wire bonding. Pin 52 for control is connected with the control substrate.

In this semiconductor device 10, flat electrode 61 of semiconductor device 10 is connected to BUS-BAR 200 for loads. Therefore, the heat generated in big current processing etc. can be made to radiate heat via BUS-BAR 200 for loads promptly. Since BUS-BAR 100 for power supplies is also connected to the back surface of first die pad 31 and second die pad 32, a radiation characteristic is improved.

In this type of semiconductor device 10, up-and-down both faces are connected to BUS-BAR 200 for loads, and BUS-BAR 100 for power supplies like the above-mentioned explanation, respectively. Pin 51 for an output and pin 52 for control are also connected to chip 20 with flat electrode 61, wire 70, etc. Therefore, when mounting, it has package structure in which both mounting is possible, such as plane mounting or mounting in the upper and lower sides.

Figure 19B:
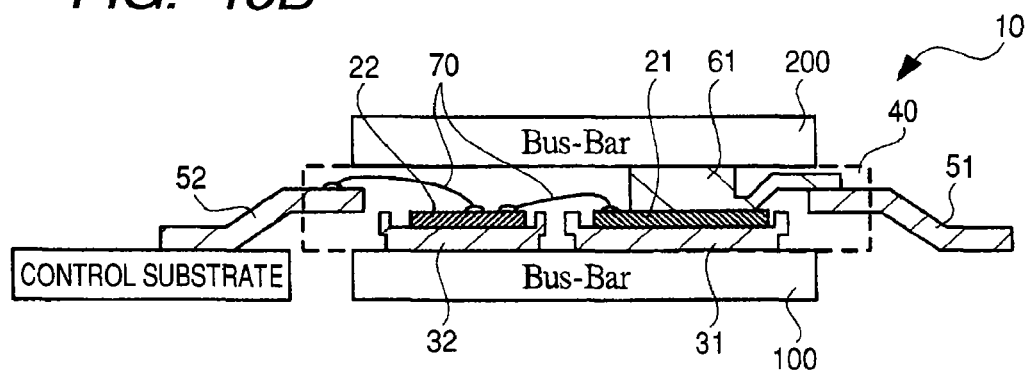
FIGS. 19B and 19C are the cross-sectional views.
Figure 19C:
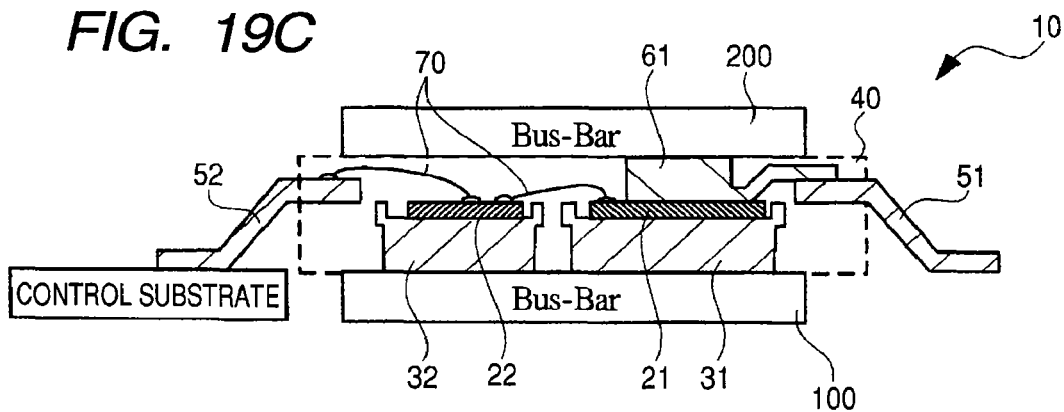

The case shown in FIG. 19B is the case where pin 51 for an output, pin 52 for control, first die pad 31, and second die pad 32 are formed by the same lead frame 50, and board thickness is formed identically. The case shown in FIG. 19C is the case which used lead frame 50 in which first die pad 31 and second die pad 32 portion are thicker than pin 51 for an output, and pin 52 for control. Other structures are the same as that of the case where it is shown in FIG. 19B.

Figure 20A:
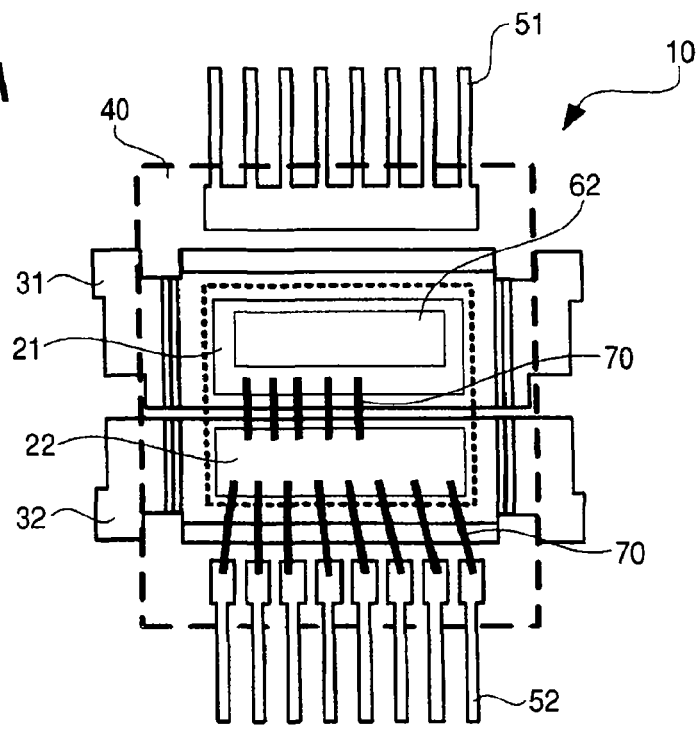
FIG. 20A is a plan view showing the plane structure of the semiconductor device concerning the present invention.

With semiconductor device 10 shown in FIG. 20A as well as Embodiment 1, first chip 21 is mounted on first die pad 31, and second chip 22 is mounted on second die pad 32. This first die pad 31 and second die pad 32 are divided in the direction in parallel with first side 41 and second side 42 of sealing body 40, and are formed independently.

Figure 20B:
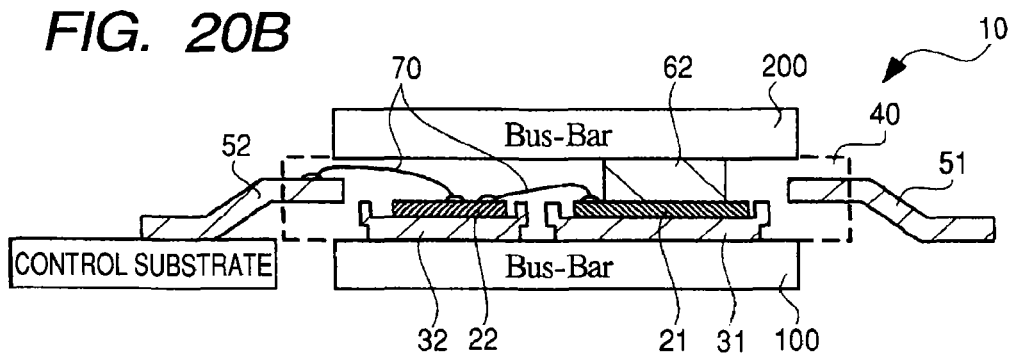
FIGS. 20B and 20C are the cross-sectional views.

As shown in FIG. 20B, in this case, pin 51 for an output at the side of first chip 21 is not connected in flat electrode 62, and pin 51 for an output is not functioning on it. However, the electrode formed in first chip 21 main surface and BUS-BAR 200 for loads are connected with flat electrode 62. This flat electrode 62 is exposed from the upper surface of sealing body 40, and the exposed surface of this flat electrode 62 is connected to BUS-BAR 200 for loads.

The back surface side of first die pad 31 and second die pad 32 is exposed from sealing body 40 and is connected to BUS-BAR 100 for power supplies. Both first chip 21, second chip 22, and second chip 22 and pin 52 for control are connected with wire 70 by wire bonding. Furthermore, pin 52 for control is connected to the control substrate.

In this semiconductor device 10, flat electrode 62 of semiconductor device 10 is connected to BUS-BAR 200 for loads. Therefore, the heat generated in big current processing etc. can be made to be able to radiate heat via BUS-BAR 200 for loads promptly. Since BUS-BAR 100 for power supplies is also connected to the back surface of first die pad 31 and second die pad 32, a radiation characteristic is improved.

In this type of semiconductor device 10, up-and-down both faces are connected to BUS-BAR 200 for loads, and BUS-BAR 100 for power supplies like the above-mentioned explanation, respectively. On the other hand, pin 51 for an output is not electrically connected with first chip 21, and it can be said to be the package only for BUS-BAR upper-and-lower-sides mounting.

Figure 20C:
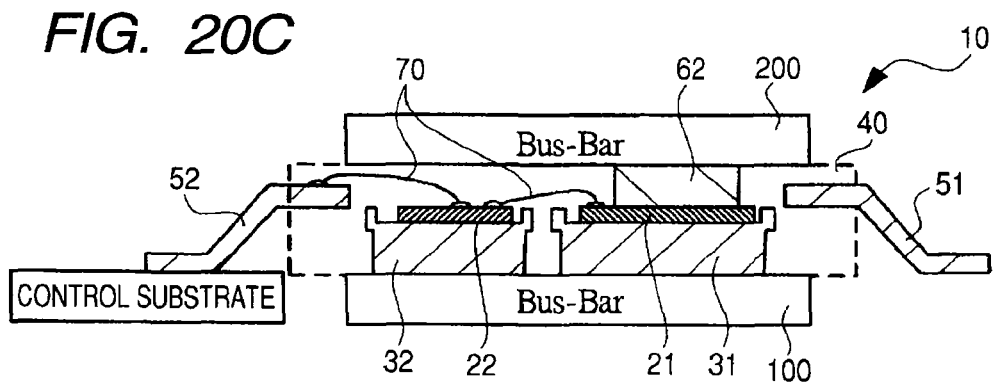

The case shown in FIG. 20B is the case where pin 51 for an output, pin 52 for control, first die pad 31, and second die pad 32 are formed by the same lead frame 50, and the board thickness is formed identically. The case shown in FIG. 20C is the case which used lead frame 50 in which the board thickness of first die pad 31 and second die pad 32 portion is thicker than pin 51 for an output and pin 52 for control. Other structures are the same as that of the case where it is shown in FIG. 20B.

Like the above-mentioned explanation, heat radiation from up-and-down both faces of sealing body 40 can be performed on the package structure with semiconductor device 10 shown in FIGS. 19A to 19C and FIGS. 20A to 20C. Unlike the heat radiation property from the under surface side of structure as shown in FIGS. 2A to 2C shown above, this heat radiation property can improve much more radiating effect. That is, thermal resistance reduction can be aimed at. In particular, the reduction effect in the excessive thermal resistance region which is generation of heat at the time of big current flowing for a short time is expectable.

As a result, low on resistance-ization in a product can be aimed at. In FIGS. 19A to 19C and FIGS. 20A to 20C, by arranging especially BUS-BAR to up-and-down both faces of sealing body 40, electric connection is performed, and especially improvement in a radiation characteristic is achieved. Load short-circuit tolerance amount, i.e., time to failure, can be raised especially in an excessive heat region on system characteristics.

As this embodiment described, namely, as shown in FIGS. 19A to 19C and FIGS. 20A to 20C, the radiation characteristic is improved by exposing a part of flat electrodes 61 and 62 from the upper surface of sealing body 40.

In semiconductor device 10 of this embodiment, although flat electrodes 61 and 62 are exposed to the upper and lower sides of sealing body 40, this structure can be manufactured at a step as shown in FIGS. 21A to 21E.

That is, at a flow diagram shown in FIG. 8 shown above, when performing some steps after the molding step of Step S201 at a step as shown in FIG. 21A, semiconductor device 10 of this structure can be manufactured. FIGS. 21B to 21E are drawings showing the contents of each step of FIG. 21A schematically.

At Step S301, a mold is performed using the supplied resin and sealing body 40 is formed. On the occasion of this mold formation, it carries out so that filling of resin may be pressed down from the upper surface of flat electrode 61 to about a few μm-tens μm. The state of the molding step of this step S301 was schematically shown in FIG. 21B.

After that, cure bake is done at Step S302, and resin polish is performed at Step S303. Namely, what is necessary is to perform liquid honing and grinding operation, and just to polish until the upper surface of flat electrode 61 is exposed to the upper surface of sealing body 40. This state was shown in FIG. 21C.

Then, terminal plating is performed at Step S304. The state of this step was shown in FIG. 21D. Cut and individually separation are performed at Step S305, in addition forming of a lead part is performed, a laser mark is attached, and it is completed. The state of this step was shown in FIG. 21E.

The structure to which flat electrode 62 is made to intervene in between, and BUS-BAR 200 for loads is connected the first chip 21 side by FIGS. 20A and 20B with semiconductor device 10 of this embodiment as measures which aim at improvement in an up-and-down double-sided radiation characteristic was shown. The present inventor thought that, as for this radiation characteristic, the effect became large by forming the resin contact surface of flat electrode 62 further so that it may become long. For example, as shown in FIG. 22A, recess 62a was formed in the side surface of flat electrode 62 formed by Cu etc. with good heat radiation property.

Since a heat transfer face is widely formed by forming this recess 62a, the radiation characteristic improves by the part.

Forming recess 62a has an effect also in prevention of the slip from resin of sealing body 40 etc. That is, as for flat electrode 62, as shown FIGS. 20A and 20B, compared with the case where the side surface is formed evenly, entanglement with resin markedly becomes good, and fear of a slip becomes nothing. Moisture resistance improvement can also be aimed at.

Figure 22A:
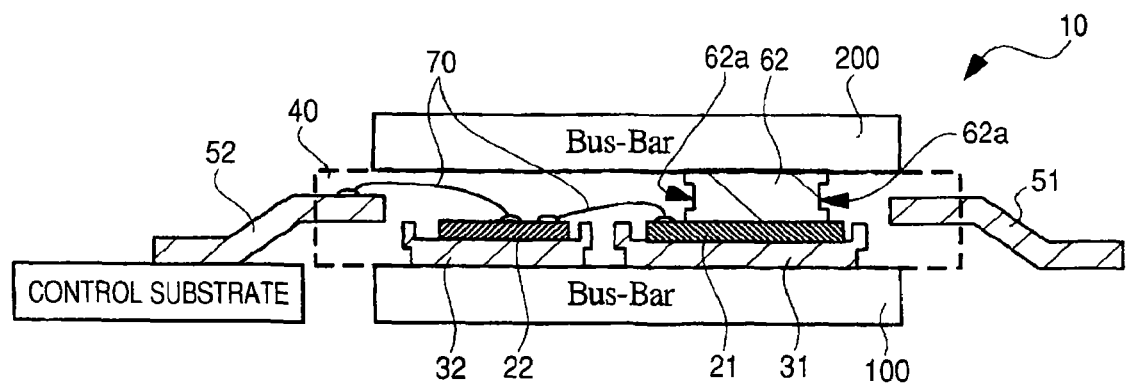
FIGS. 22A and 22B are the cross-sectional views showing schematically the section structure of the semiconductor device concerning the present invention.
Figure 22B:
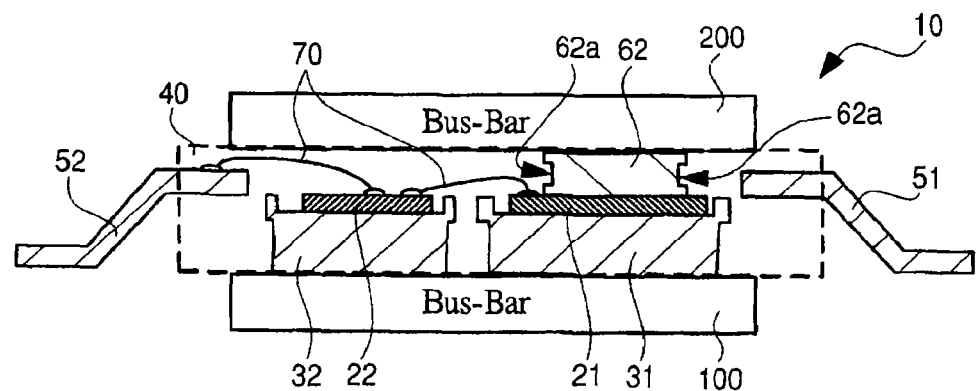

The case shown in FIG. 22A is the case where pin 51 for an output, pin 52 for control, first die pad 31, and second die pad 32 are formed by the same lead frame 50, and the board thickness is formed identically. The case shown in FIG. 22B is the case which used lead frame 50 in which the board thickness of first die pad 31 and second die pad 32 portion are thicker than pin 51 for an output, and pin 52 for control. Other structures are the same as that of the case where it is shown in FIG. 22A.

(Embodiment 8)

This embodiment shows the modification of flat electrode 61 of semiconductor device 10 explained by the Embodiment 1.

In this embodiment, as flat electrode 61 is shown in FIG. 23A, when it sees in plan view, the lead connecting part side with the lead of the pin 51 for an output etc. is formed in comb-like shape. This flat electrode 61 consists of chip side electrode connection part 61a, and electrode connection part 61b for a lead connected to the lead of the pin for an output etc., and both are connected in connection part 61c.

Chip side electrode connection part 61a is formed in the broad plate shape of a large area as shown in FIG. 23A. On the other hand, electrode connection part 61b for a lead and connection part 61c are formed to broad chip side electrode connection part 61a in the shape of a plurality of protruded pieces which has narrow width, as shown in FIG. 23A. When electrode connection part 61b for a lead and connection part 61c which were formed in the shape of a plurality of protruded pieces are seen in plan view, they look just like the tooth of a comb.

As for broad chip side electrode connection part 61a, the connection surface is formed in plane shape like electrode connection part 61b for a lead. As shown in the side view of FIG. 23B, both chip side electrode connection part 61a and electrode connection part 61b for a lead are connected in connection part 61c, and are formed widely apart. Thus, as for the thickness of flat electrode 61 formed in comb-like shape, the limb is formed thinner than the inside. The state of the section in the A-A line in FIG. 23A was shown in FIG. 23C.

By forming in this comb-like shape, it is easy to perform heat exchange with air in a protruded piece-like portion, and a radiation characteristic is improved. Compared with the case of one sheet where it forms platy, it is hard to receive deformation by stress etc., and connection reliability can be improved.

When shown in FIG. 24A, chip side electrode connection part 61a is also formed in comb-like shape. In flat electrode 61 of this structure, chip side electrode connection part 61a is also formed in the shape of a protruded piece as well as electrode connection part 61b for a lead and connection part 61c, and is projected and formed in the counter direction mutually.

The protruded piece-like portion of this chip side electrode connection part 61a and the protruded piece-like portions of electrode connection part 61b for a lead and connection part 61c are formed alternately, and both have become the form joined in 61d of basal parts. FIG. 24B showed the state from a side surface for this structure, and FIG. 24C showed the state of the section.

Thus, flat electrode 61 with which both chip side electrode connection part 61a and electrode connection part 61b for a lead were formed in comb-like shape differs in the case where only electrode connection part 61b for a lead shown in FIG. 23 is formed in comb-like shape, and the warp by the stress action of heat stress etc. can be made smaller.

As shown in FIG. 23A, in the case shown in FIGS. 23A to 23C, a stress action will be straightly transmitted from chip side electrode connection part 61a to electrode connection part 61b for a lead. However, with the structure which was formed in both-sides mutual comb-like shape and which is shown in FIGS. 24A to 24C, as shown in FIG. 24A, the stress generated in chip side electrode connection part 61a changes a transmitting direction in 61d of end basal parts, and is transmitted after that to electrode connection part 61b for a lead.

Thus, the action of stress destruction can weaken by having the structure to which the protruded piece portion of chip side electrode connection part 61a and the protruded piece portion of electrode connection part 61b for a lead were connected by turns via 61d of basal parts.

It can explain, for example that a stress destructive action can weaken also from a two-dimensional warp formula. Namely, in the formula of $\tau = L \times \alpha \times T$, it is supposed that the comb length which is the length of the protruded piece portion in FIGS. 23A to 23C, and the comb length which is the length of the protruded piece portion in FIGS. 24A to 24C were the same length a. L2 turns into L1×½, and a warp will be simply reduced by half. τ shall express the size of a warp, L shall express length, a shall express a coefficient of linear expansion, and T shall express temperature.

(Embodiment 9)

With the manufacturing method of semiconductor device 10 explained by the Embodiment 1, when doing die bonding of first chip 21 and the second chip 22 on first die pad 31 and second die pad 32, respectively, the case where soldering paste was used was explained, for example. However, to this die bond material, even if it uses other paste other than soldering paste like Ag paste, it can manufacture.

Figure 25:
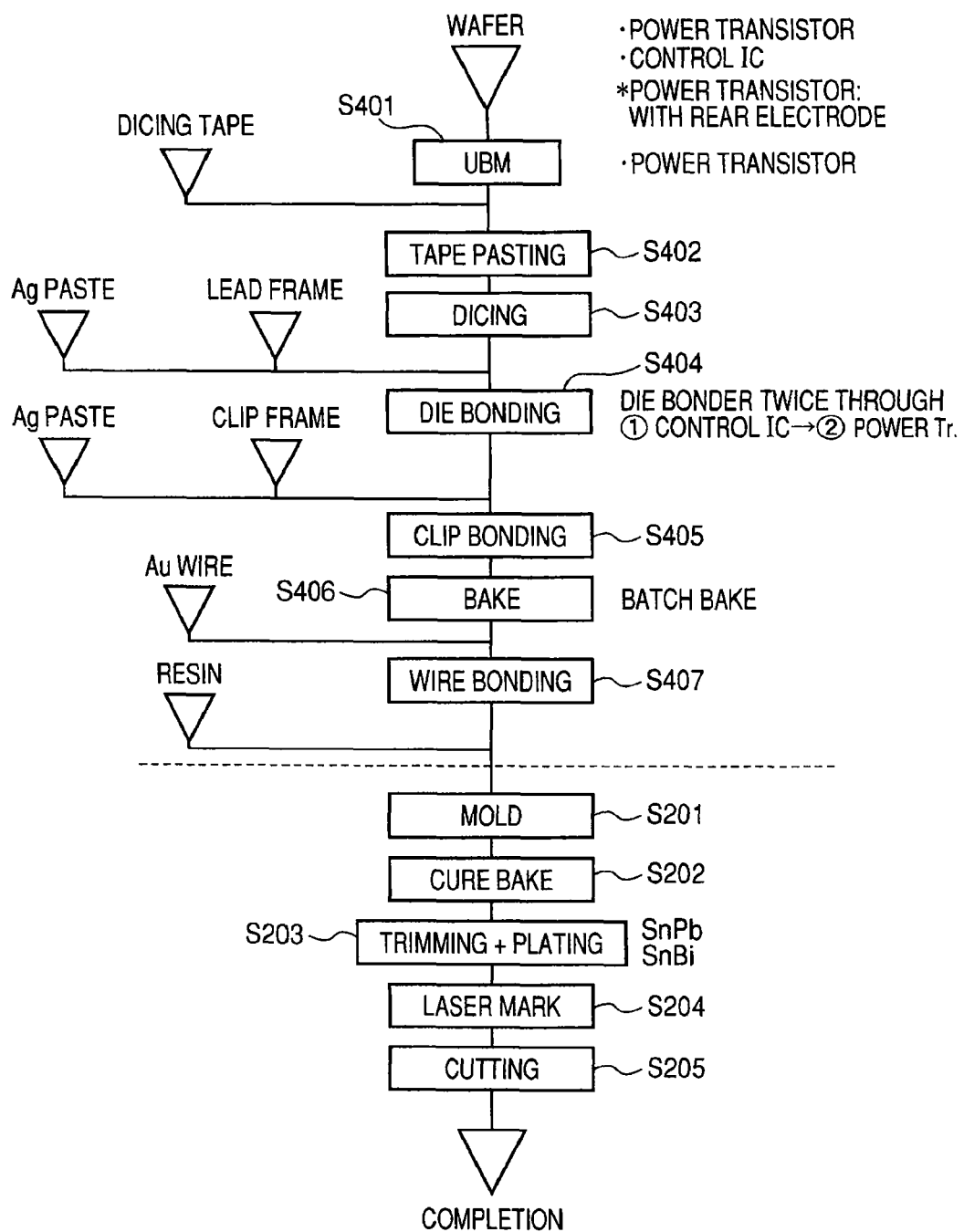
FIG. 25 is a flow diagram showing the modification of the manufacturing method of the semiconductor device of the present invention.

This embodiment explains the case where Ag paste is used for this die bond material about the manufacturing method of semiconductor device 10, along the flow diagram of FIG. 25.

Semiconductor device 10 shown in the Embodiment 1 can be manufactured through each step of a flow diagram as shown in FIG. 25, for example. That is, at Step S401 of FIG. 25, the wafer made to the stage before doing individual separation by dicing is supplied, for example. The pad electrode of aluminum is formed in the chip before this individual separation, for example, and a under bump metal (UBM) is given on this electrode pad. As this UBM, Ni, Ti, etc. are applied, for example.

Then, a dicing tape is stuck on a wafer back surface at Step S402 using the supplied dicing tape. At Step S403, dicing of the wafer is done and a chip is individually separated. In semiconductor device 10 explained by this embodiment, as shown in FIG. 1, first chip 21 and second chip 22 are formed. Therefore, the step from the above-mentioned step S401 to Step S403 will be performed by first chip 21 and second chip 22, respectively.

Thus, die bonding of the chip individually separated by dicing is done on the die pad of a lead frame by Step S404 using the Ag paste and the lead frame which were supplied. In semiconductor device 10 of this embodiment, since two chips are mounted like the above, die bonding will be performed twice. For example, what is necessary is to do die bonding of the second chip 22, and just to do die bonding of the first chip 21 after that. As for two chips, a rear electrode will be connected to a die pad by this die bonding.

Then, clip bonding is performed at Step S405 using the supplied Ag paste, and the clip frame for flat electrodes. By this clip bonding, the electrode formed in the main surface of first chip 21 and pin 51 for an output will be connected. Then, batch bake is done at Step S406, and the bonding by the Ag paste is completed.

After bonding is completed, supplied Au wire performs wire bonding at Step S407. By this wire bonding, each of first chip 21, second chip 22, and second chip 22 and pin 52 for control is electrically connected.

After that, like being shown in the FIG. 8 of the Embodiment 1, at Step S201, a mold is performed using the supplied resin. Sealing body 40 is formed of this mold, and semiconductor device 10 of the above-mentioned structure is sealed. Cure bake is done at Step S202 after a mold. It takes out from a metallic mold, and trimming is performed at Step S203, and plating treatment is carried out to the necessary place of a lead part.

A laser mark is attached at Step S204 after plating treatment, it cuts at Step S205, individual separation of semiconductor device 10 is performed, and it becomes completion of semiconductor device 10. Thus, semiconductor device 10 is manufactured by doing die bonding using Ag paste.

(Embodiment 10)

This embodiment explains the modification of semiconductor device 10 explained by the Embodiment 1.

In semiconductor device 10 explained by the Embodiment 1, chip 20 different, respectively was mounted on two die pads 30. Die pad 30 by which both chips 20 are mounted was divided in parallel to first side 41 and second side 42 of sealing body 40, and was formed independently.

In semiconductor device 10 explained by this embodiment, the number of chips 20 mounted on die pad 30 differs in the case where it is in the Embodiment 1.

That is, as shown in FIG. 26A, two chips 21a which are N-channel MOS FET are mounted as mounting chip 20 on first die pad 31, for example. On second die pad 32, second chip 22 comprising circuit 22a for a drive which drives a power transistor is mounted.

A plurality of chips 21a mounted on this first die pad 31 are electrically connected with lead 50a by flat electrode 61 at the electrode formed in the main surface of chip 21a, respectively. A plurality of chips 21a and second chip 22 are connected with wire 70 by wire bonding. Lead 50b is also connected with second chip 22 with wire 70 by wire bonding.

Like the Embodiment 1, first die pad 31 which mounts a plurality of chips 21a, and second die pad 32 which mounts second chip 22 are divided between leads 50a and 50b in the directions parallel to first side 41 and second side 42 of sealing body 40. First die pad 31 and second die pad 32 are formed by the same lead frame 50. Board thickness is identically formed, as shown in FIGS. 26B and 26D.

Even if it is the same regarding lead frame 50, when die pad 30 portion is formed thickly unlike other lead parts, it comes to be shown in FIGS. 26C and 26E. End portions 30a of die pad 30 are set up more highly than the upper surface of chip 21a and second chip 22 which are mounted, respectively at first die pad 31 and second die pad 32.

The equivalent circuit block diagram of this semiconductor device is shown in FIG. 26F. Nch1 and Nch2 MOSFET build in the temperature detection diode which transmits the temperature information for element protection to the circuit for a drive, and sub MOSFET of the number of cells of a certain ratio (for example, 2000:1) to MOSFET which sends the main current which transmits current information, respectively. The circuit for a drive has a function which controls the gate of MOSFET to make FET OFF or to suppress current in response to the input/output which controls each MOSFET independently, and temperature information and current information.

(Embodiment 11)

This embodiment explains the modification of semiconductor device 10 explained by the Embodiment 1.

Figure 27A:
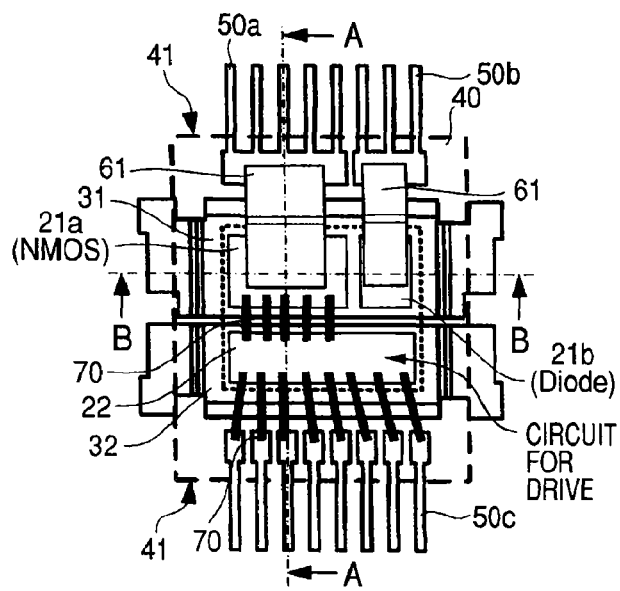
FIGS. 27A to 27E are explanatory diagrams showing the structure of the semiconductor device relevant to the present invention.

When shown in FIG. 27A, in semiconductor device 10 explained by this embodiment, for example, chip 21a which is N-channel MOS FET and chip 21b which is a diode are mounted as mounting chip 20 on first die pad 31. On second die pad 32 divided independently of first die pad 31, second chip 22 comprising circuit 22a for a drive is mounted.

Chip 21a and lead 50a are connected by flat electrode 61. Lead 50b is also connected with chip 21b by flat electrode 63. This chip 21a is connected with second chip 22 with wire 70. Lead 50c is also connected with second chip 22 with wire 70.

As shown in FIG. 27A, first die pad 31 and second die pad 32 are divided between leads 50a and 50b and lead 50c in the direction parallel to first side 41 and second side 42 of sealing body 40, and are formed independently.

Figures 27B, 27C:
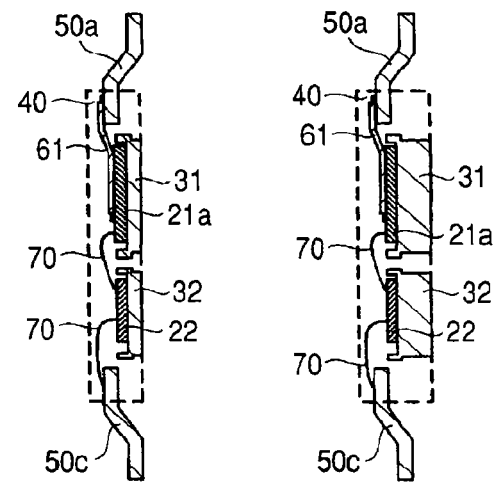
Figure 27D:
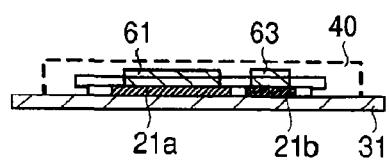
Figure 27E:
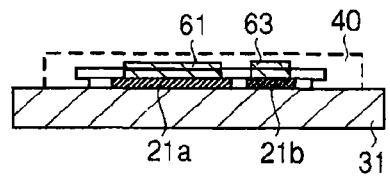

These leads 50a, 50b, and 50c are formed in the form mutually divided by the same lead frame 50. The case where the structure of the same thickness is used for the same lead frame 50 is shown in FIGS. 27B and 27D like the FIGS. 26B to 26E. The case where the thickness of die pad 30 was thicker than a lead part was shown in FIGS. 27C and 27E.

Figure 27F:
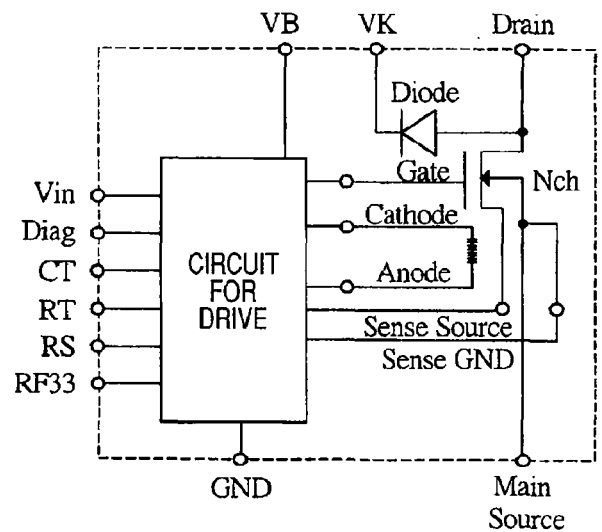
FIG. 27F is a block diagram showing the circuit configuration.

The equivalent circuit block diagram of this semiconductor device is shown in FIG. 27F. Nch MOSFET builds in the temperature detection diode which transmits the temperature information for element protection to the circuit for a drive, and sub MOSFET of the number of cells of a certain ratio (for example, 2000:1) to MOSFET which sends the main current which transmits current information. The circuit for a drive has a function which controls the gate of MOSFET to make FET OFF or to suppress current in response to the input/output which controls MOSFET, and temperature information and current information. By connecting VK terminal and a Drain terminal to motor ends, a Diode chip functions as a regeneration element when MOFSET turns off.

(Embodiment 12)

This embodiment explains the modification of semiconductor device 10 explained by the Embodiment 1.

Figure 28A:
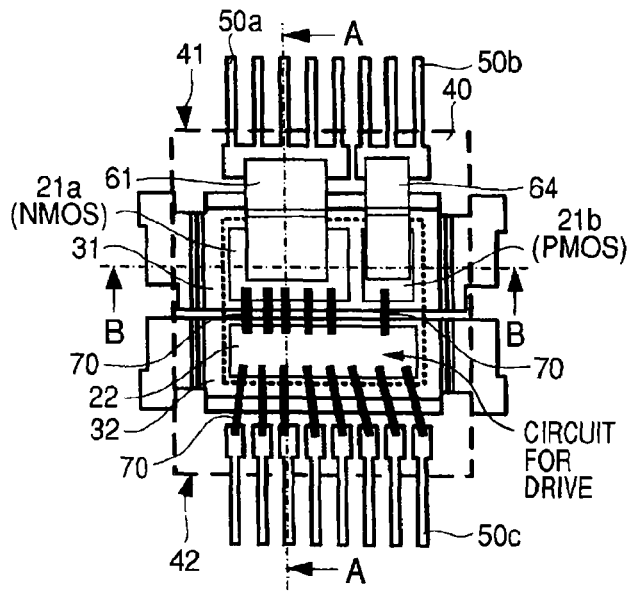
FIGS. 28A to 28E are explanatory diagrams showing the structure of the semiconductor device relevant to the present invention.

When shown in FIG. 28A, in semiconductor device 10 explained by this embodiment, chip 21a which is N-channel MOS FET, and chip 21b which is P channel MOSFET are mounted as mounting chip 20 on first die pad 31. On second die pad 32 divided independently of first die pad 31, second chip 22 comprising circuit 22a for a drive is mounted.

Chip 21a and lead 50a are connected by flat electrode 61. Lead 50b is also connected with chip 21b by flat electrode 64. This chip 21a is connected with second chip 22 with wire 70. Chip 21b and second chip 22 are also connected with wire 70. Lead 50c is also connected with second chip 22 with wire 70.

As shown in FIG. 28A, first die pad 31 and second die pad 32 are divided between leads 50a and 50b and lead 50c in the direction parallel to first side 41 and second side 42 of sealing body 40, and are formed independently.

Figures 28B, 28C:
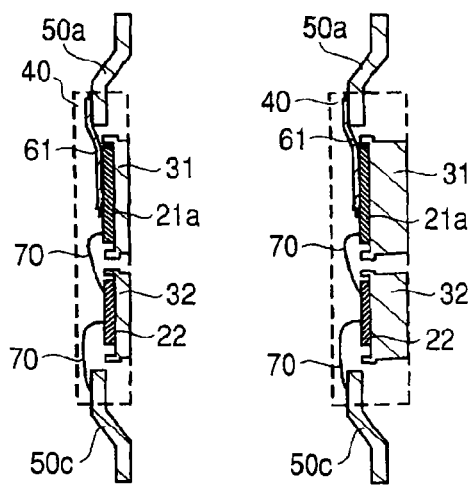
Figure 28D:
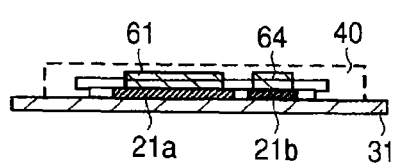
Figure 28E:
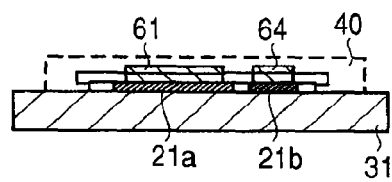

These leads 50a, 50b, and 50c are formed in the form mutually divided with the same lead frame 50. The case where the thing of the same thickness is used for the same lead frame 50 is shown in FIGS. 28B and 28D like the FIGS. 26B to 26E. The case where the thickness of die pad 30 was thicker than a lead part was shown in FIGS. 28C and 28E.

Figure 28F:
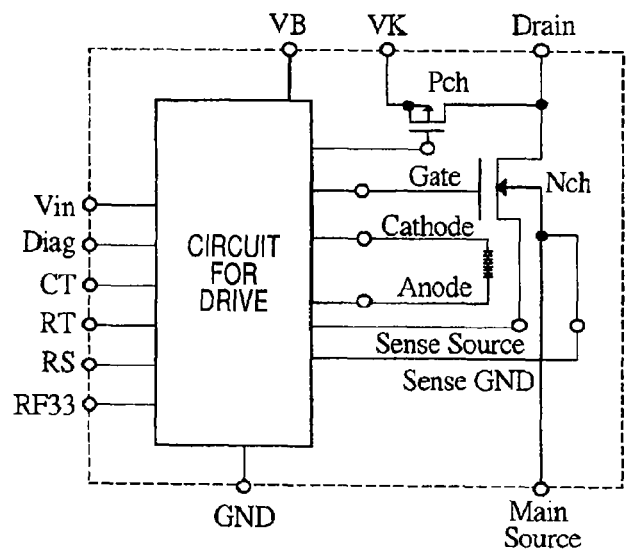
FIG. 28F is a block diagram showing the circuit configuration.

The equivalent circuit block diagram of this semiconductor device is shown in FIG. 28F. Nch MOSFET builds in the temperature detection diode which transmits the temperature information for element protection to the circuit for a drive, and sub MOSFET of the number of cells of a certain ratio (for example, 2000:1) to MOSFET which sends the main current which transmits current information. The circuit for a drive has a function which controls the gate of MOSFET to make FET OFF or to suppress current in response to the input/output which controls MOSFET, and temperature information and current information.

By connecting VK terminal and a Drain terminal to motor ends, Pch MOSFET functions as a regeneration element when MOSFET turns off. Compared with the case where a Diode element is used as a regeneration element, by making Pch MOSFET turn on, it becomes possible to reduce the loss at the time of regeneration, and efficiency is improved at the time of regeneration.

(Embodiment 13)

This embodiment explains the modification of semiconductor device 10 explained by the Embodiment 1.

Figure 29A:
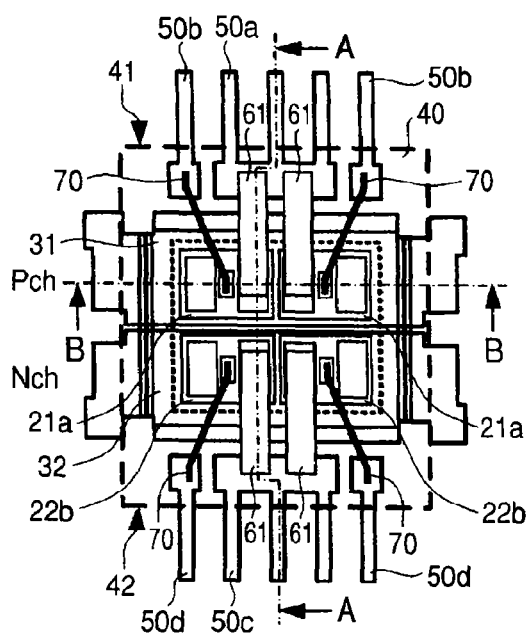
FIGS. 29A to 29E are explanatory diagrams showing the structure of the semiconductor device relevant to the present invention.

When shown in FIG. 29A, in semiconductor device 10 explained by this embodiment, two chips 21a which are P channel MOSFET are mounted as mounting chip 20 on first die pad 31, for example. On second die pad 32 divided independently of first die pad 31, two chips 22b which are N-channel MOS FET are mounted.

Common lead 50a for sources is connected by flat electrode 61, and each chip 21a mounted on first die pad 31 is connected with lead 50b for gates formed independently with wire 70. On the other hand, each chip 22b mounted on second die pad 32 is connected with lead 50c for common sources by flat electrode 61, and lead 50d for gates formed independently is connected with wire 70.

As shown in FIG. 29A, first die pad 31 and second die pad 32 are divided between leads 50a and 50b and leads 50c and 50d in the direction parallel to first side 41 and second side 42 of sealing body 40, and are formed independently.

Figures 29B, 29C:
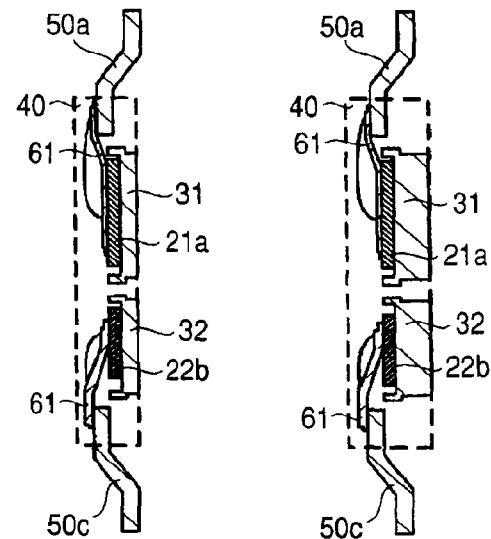
Figure 29D:
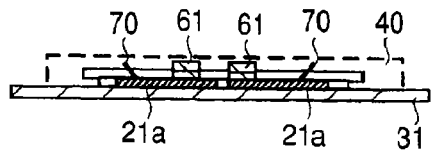
Figure 29E:
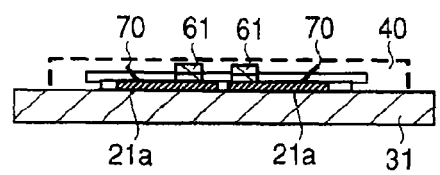

These leads 50a, 50b, 50c, and 50d are formed so that it may be mutually divided with the same lead frame 50. The case where the structure of the same thickness is used for the same lead frame 50 is shown in FIGS. 29B and 29D like the FIGS. 26B to 26E. The case where the thickness of die pad 30 was thicker than a lead part was shown in FIGS. 29C and 29E.

Figure 29F:
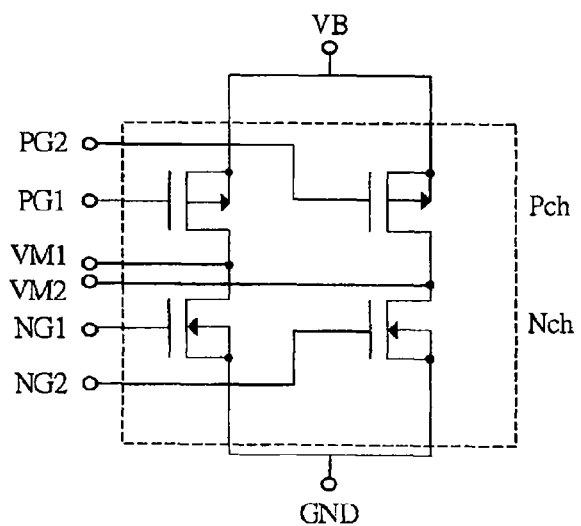
FIG. 29F is the circuit diagram.

The equivalent circuit block diagram of this semiconductor device is shown in FIG. 29F. Every two Pch and Nch MOSFET each is mounted and H bridge circuit is formed. The gate terminal of each MOSFET has appeared in the external output terminal independently, and it can apply to control of a positive inversion motor by preparing H bridge controller outside.

(Embodiment 14)

This embodiment explains the modification of semiconductor device 10 explained by the Embodiment 1.

Figure 30A:
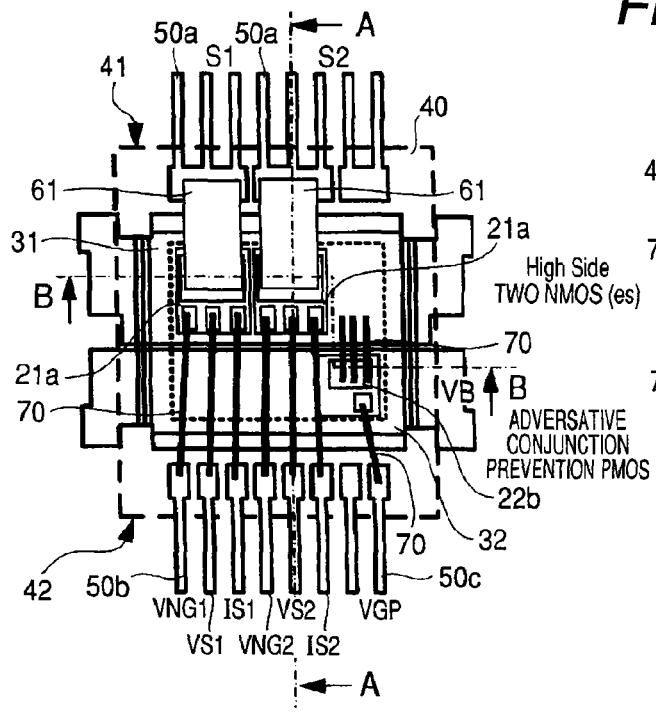
FIGS. 30A to 30E are explanatory diagrams showing the structure of the semiconductor device relevant to the present invention.

In semiconductor device 10 which explains the structure shown in FIG. 30A by this embodiment, two chips 21a which are N-channel MOS FET are mounted as mounting chip 20 on first die pad 31, for example. On second die pad 32 divided independently of first die pad 31, chip 22b which is P channel MOSFET is mounted.

As for chip 21a mounted on first die pad 31, the source electrode is connected with lead 50a by flat electrode 61. The gate electrode is connected with lead 50b of the direction opposite to lead 50a with wire 70. On the other hand, as for chip 22b mounted on second die pad 32, the first die pad 31 side and lead 50c are connected with wire 70, respectively.

As shown in FIG. 30A, first die pad 31 and second die pad 32 are divided independently in the direction parallel to first side 41 and second side 42 of sealing body 40.

Figures 30B, 30C:
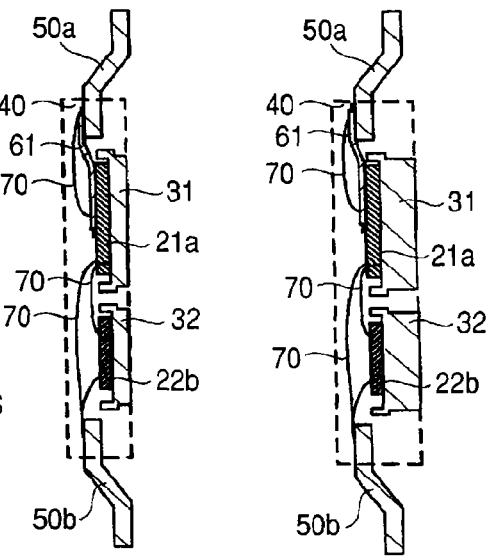
Figure 30D:
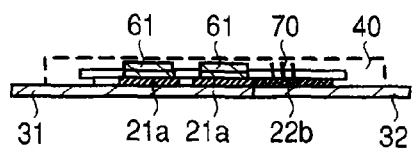
Figure 30E:
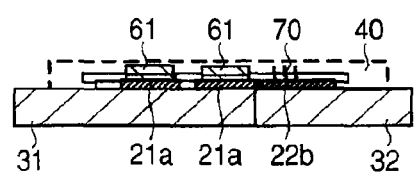

Leads 50a, 50b, and 50c are formed so that it may be mutually divided with the same lead frame 50. The case where the structure of the same thickness is used for the same lead frame 50 is shown in FIGS. 30B and 30D like the FIGS. 26B to 20E. The case where the thickness of die pad 30 was thicker than a lead part was shown in FIGS. 30C and 30E.

Figure 30F:
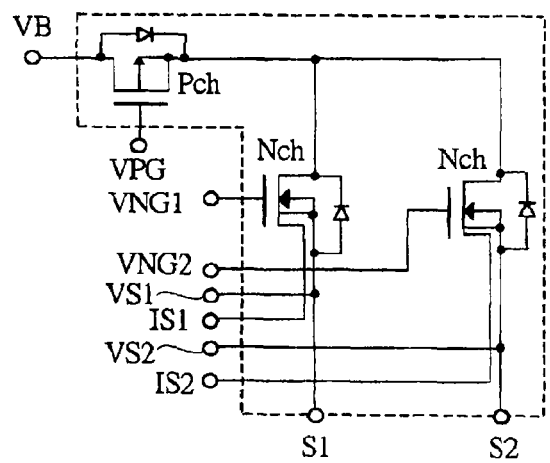
FIG. 30F is a block diagram showing the circuit configuration.

The equivalent circuit block diagram of this semiconductor device is shown in FIG. 30F. Each Nch MOSFET builds in the temperature detection diode which transmits the temperature information for element protection to the circuit for a drive, and sub MOSFET of the number of cells of a certain ratio (for example, 2000:1) to MOSFET which sends the main current which transmits current information. Each Nch MOSFET forms the high side side of H bridge circuit. It connects with the power supply side upstream of Nch MOSFET, and Pch MOSFET prevents the reverse current electrical connection at the time of battery reverse connection. It controls from the outside so that a battery turns off at the time of reverse connection and usually turns on.

(Embodiment 15)

This embodiment explains the modification of semiconductor device 10 explained by the Embodiment 1.

Figure 31A:
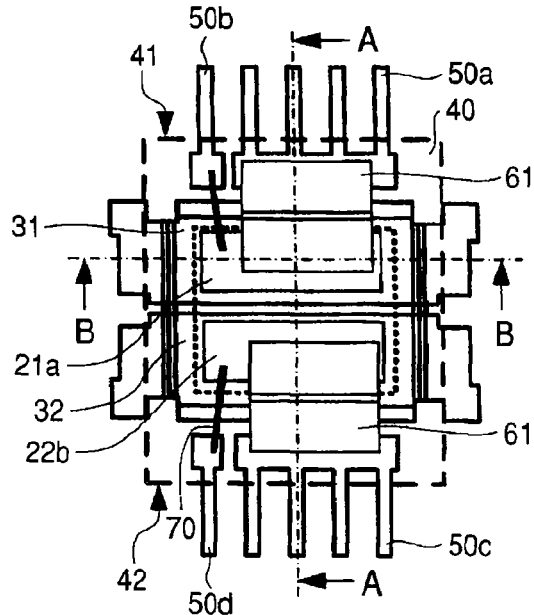
FIGS. 31A to 31E are explanatory diagrams showing the structure of the semiconductor device relevant to the present invention.

When shown in FIG. 31A, in semiconductor device 10 explained by this embodiment, chip 21a which is MOSFET is mounted as mounting chip 20 on first die pad 31, for example. Chip 22b which is MOSFET is mounted also on second die pad 32 divided independently of first die pad 31.

The source electrode of chip 21a is connected with lead 50a by flat electrode 61, and the gate electrode is connected with lead 50b with wire 70. Similarly, as for chip 22b, a source electrode is connected with lead 50c by flat electrode 61, and the gate electrode is connected with lead 50d with wire 70.

As shown in FIG. 31A, first die pad 31 and second die pad 32 are divided in a direction parallel to first side 41 and second side 42 of sealing body 40, and are formed independently.

Figures 31B, 31C:
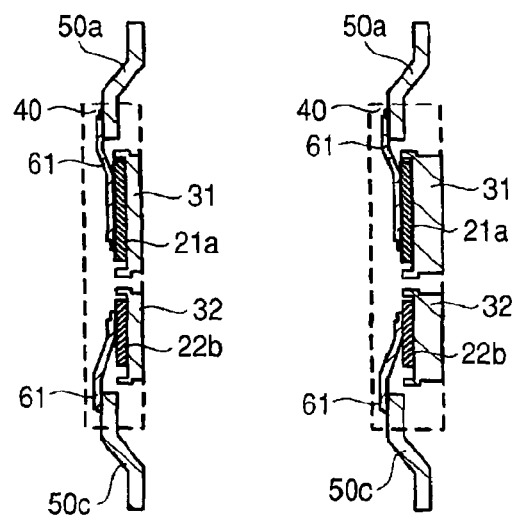
Figure 31D:
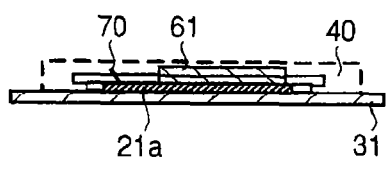
Figure 31E:
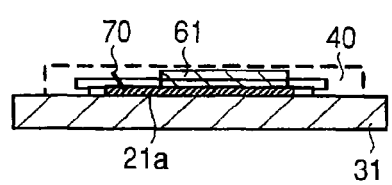
Figure 31F:
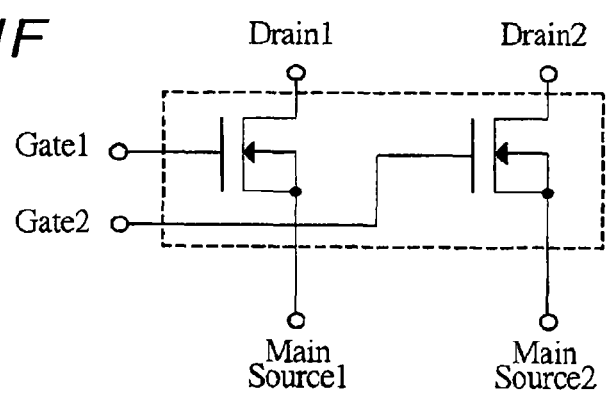
FIG. 31F is a block diagram showing the circuit configuration.

Leads 50a, 50b, 50c, and 50d are formed by the same lead frame 50. The case where the structure of the same thickness is used for the same lead frame 50 is shown in FIGS. 31B and 31D like the FIGS. 26B to 26E. The case where the thickness of die pad 30 was thicker than a lead part was shown in FIGS. 31C and 31E. The circuit configuration formed by FIG. 31A was shown in FIG. 31F.

(Embodiment 16)

In any case, the embodiment mentioned and explained at the example the case where the mold of the chip mounting surface of a die pad and the connection surface of a lead where electric connection are made with a chip was done in the state of different height.

Figure 32A:
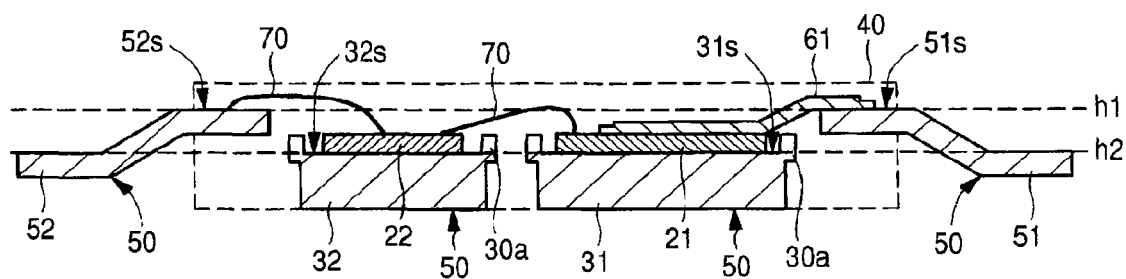
FIG. 32A is a cross-sectional view showing schematically a mold situation in case a chip mounting surface and a lead connection surface are different height.

For example, as shown in FIG. 32A, in the case of the Embodiment 1, pin 51 for an output, first die pad 31, second die pad 32, and pin 52 for control were formed using lead frame 50 of the same one-sheet structure.

The mounting surface 31s of chip 21 of this first die pad 31 and the mounting surface 32s of chip 22 of second die pad 32 were arranged in the same height h1. On the other hand, the connection surface 51s of pin 51 for an output and the connection surface 52s of pin 52 for control were arranged in different height h2 from height h1. Thus, the mold was done in the state where height differs between height h1 of a chip mounting surface, and height h2 of a lead connection surface, and sealing body 40 was formed.

This sealing body 40 is formed by doing a mold, where lead frame 50 is pinched with the upper die, and a lower die of a metal mold. Therefore, in order to perform a mold in the state where the height of a chip mounting surface and a lead connection surface differs, as mentioned above, the corresponding level difference portion in the upper die and lower die of a metal mold will increase, and the structure of a metallic mold will become complicated. In addition to it, the metallic molds for bending also increase in number because a level difference increases as mentioned above, and it becomes less efficient.

Figure 32B:
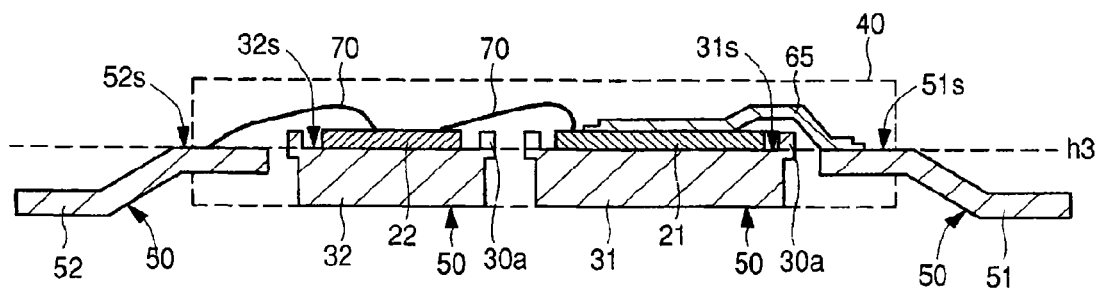
FIG. 32B is a cross-sectional view showing schematically a mold situation in case a chip mounting surface and a lead connection surface are the same height.

Then, as shown in FIG. 32B, a present inventor conceived that they performed a mold as the mounting surface 31s of chip 21 of first die pad 31, the mounting surface 32s of chip 22 of second die pad 32, the connection surface 51s of pin 51 for an output, and the connection surface 52s of pin 52 for control constitute the same height h3.

Figure 32C:
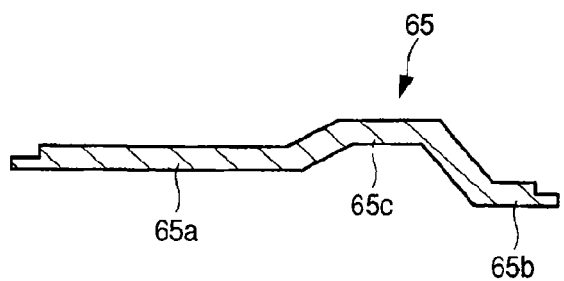
FIG. 32C is a partially sectional view showing the structure of the flat electrode used with the structure shown in FIG. 32B.

Thus, as shown in FIG. 32C when a chip mounting surface and a lead connection surface are formed in the same height, as for flat electrode 65 which connects first chip 21 and pin 51 for an output, chip side electrode connection part 65a and electrode connection part 65b for a lead which were formed so that they are widely apart and in parallel are connected in connection part 65c formed so that end portion 30a of first die pad 31 might be straddled.

Figure 33A:
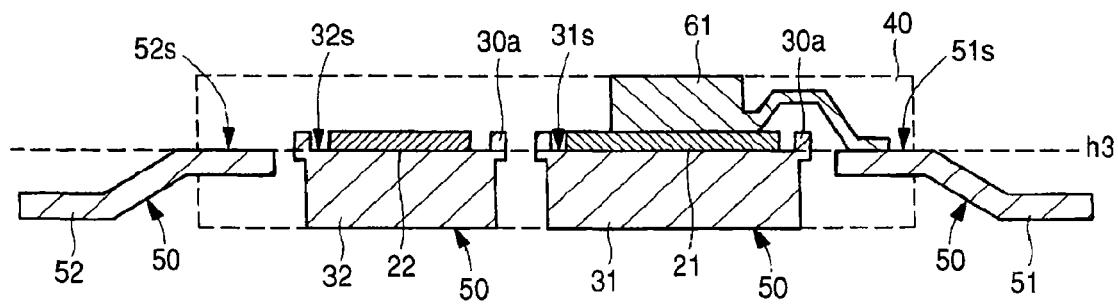
FIGS. 33A to 33C are cross-sectional views showing schematically the structure of the modification of a mold situation in case a chip mounting surface and a lead connection surface are the same height.
Figure 33B:
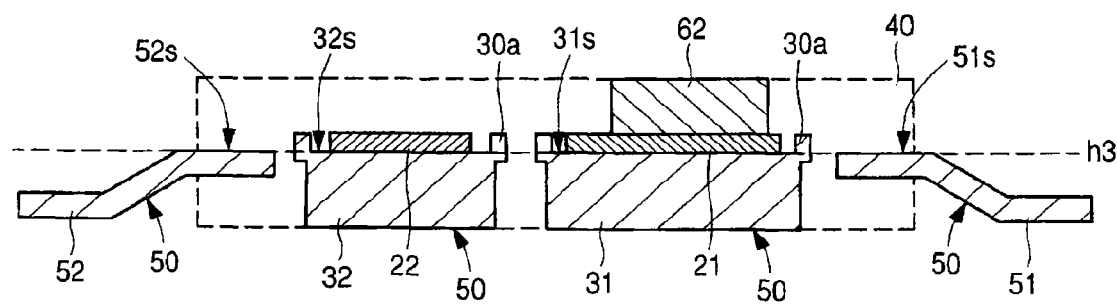
Figure 33C:
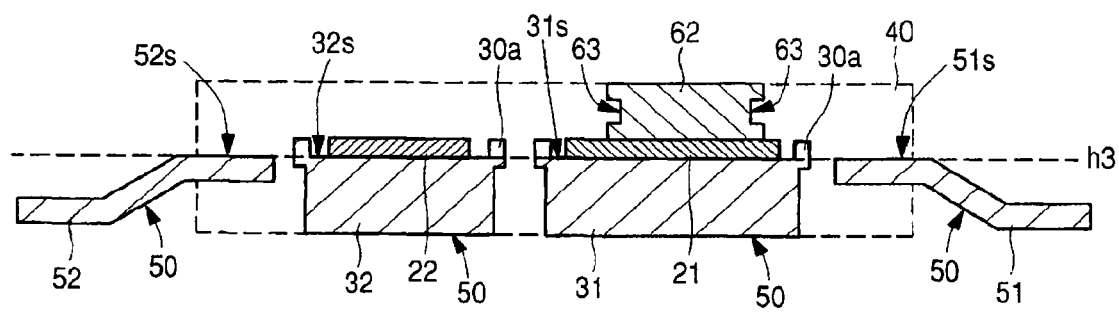

Thus, on the occasion of a mold, the method of changing into the state where the height of a chip mounting surface and a lead connection surface was arranged with the same height can be applied, for example, even when shown in FIGS. 33A, 33B, and 33C. The case where it is shown in FIGS. 33A, 33B, and 33C is a case of the FIG. 19C, FIG. 20C, and FIG. 22B which were explained by the Embodiment 7.

It is a case where lead frame 50 of the one-sheet structure in which thickness was thickly formed for first die pad 31 and second die pad 32 portion rather than pin 51 for an output and pin 52 for control is used in the example shown in FIGS. 32A, 32B, and FIGS. 33A, 33B and 33C. However, pin 51 for an output, first die pad 31, second die pad 32, and pin 52 for control may be formed using lead frame 50 of the one-sheet structure of the same thickness.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

Although the embodiment explained the example which uses MOSFET as a power transistor, MISFET, IGBT (Insulated gate bipolar transistor), etc. may be used for this power transistor.

In a field of a semiconductor device, the present invention can be effectively used, when it forms a mounting wiring with an easy wiring layout especially.

What is claimed is:

1. An electronic device comprising:
   a first semiconductor device having a first terminal, and a second terminal which has a part thereof exposed from a bottom surface of a sealing body; and
   a wiring substrate having a main surface over which the first semiconductor device is mounted and a plurality of wiring patterns is formed, parts of the plurality of wiring patterns being electrically connected to the first semiconductor device,
   wherein a first wiring pattern of the plurality of wiring patterns is electrically connected to the first terminal of the first semiconductor device,
   wherein a second wiring pattern of the plurality of wiring patterns is electrically connected to the second terminal of the first semiconductor device,
   wherein, in a plan view from a main surface side of the wiring substrate, the second wiring pattern has a linearly-extending first portion,
   wherein, in the plan view, the first semiconductor device is mounted over the main surface of the wiring substrate such that a part of the sealing body thereof overlaps with the first portion of the second wiring pattern, and
   wherein, in the plan view, the first terminal extends in a second direction which intersects with a first direction in which the first portion of the second wiring pattern extends.

2. The electronic device according to claim 1, further comprising,
   a second semiconductor device having a same configuration as the first semiconductor device,
   wherein a third wiring pattern of the plurality of wiring patterns is electrically connected to a first terminal of the second semiconductor device,
   wherein the second wiring pattern of the plurality of wiring patterns is electrically connected to a second terminal of the second semiconductor device,
   wherein, in the plan view, the second semiconductor device is mounted over the main surface such that the sealing body thereof overlaps with the first portion of the second wiring pattern and the second semiconductor device is located adjacent to the first semiconductor device, and
   wherein, in the plan view, the first terminal of the second semiconductor device extends in the first direction.

3. The electronic device according to claim 1,
   wherein the first terminal of the first semiconductor device protrudes from a first side surface of the sealing body, such that the sealing body thereof does not overlap with the first wiring pattern in the plan view.

4. The electronic device according to claim 1,
   wherein the first semiconductor device has a third terminal,
   wherein a fourth wiring pattern of the plurality of wiring patterns is electrically connected to the third terminal of the first semiconductor device, and
   wherein the third terminal of the first semiconductor device extends in a third direction opposite the second direction.

5. The electronic device according to claim 4,
   wherein the sealing body of the first semiconductor device has a first side surface and a second side surface opposite the first side surface, and
   wherein, in the plan view, the first and third terminals respectively protrude from the first and second side surfaces of the sealing body.

6. The electronic device according to claim 1,
   wherein the first semiconductor device has a first semiconductor chip mounted over a surface of the second terminal opposite a surface of the second terminal exposed from the bottom surface of the sealing body, and
   wherein the first semiconductor chip has a first surface over which a first electrode pad electrically connected to the first terminal is formed and a second surface over which a second electrode electrically connected to the second terminal is formed.

7. The electronic device according to claim 6,
   wherein the first semiconductor chip includes a power transistor, and
   wherein the first electrode pad is a source electrode pad and the second electrode is a drain electrode.

8. The electronic device according to claim 7,
   wherein the second wiring pattern is a wiring pattern to supply a power supply to the first semiconductor chip.

9. The electronic device according to claim 7,
   wherein the first semiconductor device has a second semiconductor chip which includes a driver circuit to drive the first semiconductor chip, and
   wherein a gate electrode pad electrically connected to the second semiconductor chip is formed over the first surface of the first semiconductor chip.

10. An electronic device comprising:
    a first semiconductor device having a first terminal, a second terminal which has a part exposed from a bottom surface of a sealing body, a third terminal which has a part exposed from the bottom surface of the sealing body, and a fourth terminal; and
    a wiring substrate having a main surface over which the first semiconductor device is mounted and a plurality of wiring patterns are formed, parts of the plurality of wiring patterns being electrically connected to the first semiconductor device,
    wherein a first wiring pattern of the plurality of wiring patterns is electrically connected to the first terminal of the first semiconductor device,
    wherein a second wiring pattern of the plurality of wiring patterns is electrically connected to the second terminal of the first semiconductor device,
    wherein a third wiring pattern of the plurality of wiring patterns is electrically connected to the third terminal of the first semiconductor device,
    wherein a fourth wiring pattern of the plurality of wiring patterns is electrically connected to the fourth terminal of the first semiconductor device,
    wherein, in a plan view from a main surface side of the wiring substrate, the second wiring pattern has a linearly-extending first portion,
    wherein, in the plan view, the first semiconductor device is mounted over the main surface of the wiring substrate such that a part of the sealing body thereof overlaps with the first portion of the second wiring pattern,
    wherein the sealing body has a first side surface and a second side surface opposite the first side surface,
    wherein, in the plan view, the first terminal protrudes from the first side surface of the sealing body in a second direction which intersects with a first direction in which the first portion of the second wiring pattern extends, and wherein, in the plan view, the fourth terminal is protruded from the second side surface of the sealing body in a third direction opposite the second direction.

11. The electronic device according to claim 10, wherein a first semiconductor chip which includes a power transistor is mounted over a surface opposite a surface of the second terminal exposed from the bottom surface of the sealing body, wherein a second semiconductor chip which includes a driver circuit to drive the first semiconductor chip is mounted over a surface opposite a surface of the third terminal exposed from the bottom surface of the sealing body, wherein the first semiconductor chip has a first surface over which a source electrode pad and a gate electrode pad are formed, and a second surface over which a drain electrode is formed, wherein the source electrode pad of the first semiconductor chip is electrically connected to the first terminal, wherein the gate electrode pad of the first semiconductor chip is electrically connected to the second semiconductor chip, and wherein the drain electrode is electrically connected to the second terminal.

12. The electronic device according to claim 11, wherein the second semiconductor chip is electrically connected to the fourth terminal.

13. The electronic device according to claim 4, further comprising:

a third semiconductor device for controlling the first semiconductor device mounted over the main surface of the wiring substrate, wherein, in the plan view, the third semiconductor device is disposed nearer to the third terminal than to the first terminal of the first semiconductor device and adjacent to the first semiconductor device, and wherein the third semiconductor device is electrically connected to the first semiconductor device via the fourth wiring pattern.

14. The electronic device according to claim 10, further comprising:

a third semiconductor device for controlling the first semiconductor device mounted over the main surface of the wiring substrate, wherein, in the plan view, the third semiconductor device is disposed nearer to the third terminal than to the first terminal of the first semiconductor device and adjacent to the first semiconductor device, and wherein the third semiconductor device is electrically connected to the first semiconductor device via the fourth wiring pattern.

15. An electronic device comprising:

a wiring substrate having a plurality of wiring patterns including a first wiring pattern and a second wiring pattern; and a first semiconductor device mounted on the wiring substrate and having a first terminal exposed from a bottom surface of a sealing body of the first semiconductor device and a second terminal projecting from a side surface of the sealing body, wherein the first terminal is disposed over and electrically connected to a portion of the second wiring pattern extending linearly in a first direction, wherein the second terminal extends in a second direction substantially perpendicular to the first direction and is electrically connected to the first wiring pattern, wherein, in a plan view, the first semiconductor device is mounted such that a part of the sealing body thereof overlaps with a linearly extending portion of the second wiring pattern, and wherein, in the plan view, the first and second wiring patterns do not intersect.

16. The electronic device according to claim 15, further comprising:

at least one additional semiconductor device mounted on the wiring substrate and having a same configuration as the first semiconductor device, each additional semiconductor device being spaced from said first semiconductor device along said first direction and having the respective first terminal thereof disposed over and electrically connected to the linearly extending portion of the second wiring pattern; and for each additional semiconductor device, a corresponding additional wiring pattern of the plurality of wiring patterns electrically connected to the first terminal of the additional semiconductor device, wherein, in the plan view, each additional semiconductor device is mounted such that a part of the sealing body thereof overlaps with a portion of the second wiring pattern, and wherein, in the plan view, none of the first, second, and additional wiring patterns intersect with another.

17. The electronic device according to claim 16, wherein each of the first, second, and additional wiring patterns are formed in a same plane.

* * * * *